(12) United States Patent
Kim et al.

(10) Patent No.: US 11,437,462 B2
(45) Date of Patent: Sep. 6, 2022

(54) STRETCHABLE DISPLAY DEVICE

(71) Applicant: LG Display Co., Ltd., Seoul (KR)

(72) Inventors: Eunah Kim, Seosan-si (KR); Seulki Kim, Seosan-si (KR); Hyunju Jung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 127 days.

(21) Appl. No.: 17/031,619

(22) Filed: Sep. 24, 2020

(65) Prior Publication Data

US 2021/0098555 A1    Apr. 1, 2021

(30) Foreign Application Priority Data

Sep. 26, 2019    (KR) .................. 10-2019-0119067

(51) Int. Cl.
  *H01L 27/32*    (2006.01)
(52) U.S. Cl.
  CPC ........ *H01L 27/3276* (2013.01); *H01L 27/326* (2013.01)
(58) Field of Classification Search
  CPC .................................................. H01L 27/3276
  See application file for complete search history.

(56) References Cited

U.S. PATENT DOCUMENTS

| | | | |
|---|---|---|---|
| 2016/0240802 A1* | 8/2016 | Lee | H01L 27/3241 |
| 2017/0279057 A1* | 9/2017 | Park | H01L 51/52 |
| 2018/0046221 A1* | 2/2018 | Choi | G02B 26/0825 |
| 2019/0198782 A1* | 6/2019 | Kim | H01L 27/1248 |
| 2019/0341433 A1* | 11/2019 | Im | H01L 51/529 |
| 2019/0392786 A1* | 12/2019 | Chida | H01L 27/3276 |
| 2020/0168590 A1* | 5/2020 | Kim | H01L 25/13 |
| 2020/0168824 A1* | 5/2020 | Park | H01L 27/3244 |
| 2020/0203312 A1* | 6/2020 | Yun | H01L 27/3276 |
| 2021/0027671 A1* | 1/2021 | Lee | H01L 27/3244 |
| 2021/0027673 A1* | 1/2021 | Kim | H01L 51/5271 |
| 2021/0028155 A1* | 1/2021 | Kim | H01L 25/162 |
| 2021/0063610 A1* | 3/2021 | Zhu | G06F 1/1652 |

FOREIGN PATENT DOCUMENTS

KR    2018-0127124 A    11/2018

* cited by examiner

*Primary Examiner* — Douglas M Menz
(74) *Attorney, Agent, or Firm* — Seed IP Law Group LLP

(57) ABSTRACT

In one or more embodiments, a stretchable display device includes a lower substrate on which a display area displaying an image and a non-display area adjacent to the display area are defined. A plurality of pixel substrates is disposed in the display area, and a plurality of outer substrates is disposed in the non-display area. A plurality of pixels is disposed on the plurality of pixel substrates. A plurality of gate drivers is disposed on the plurality of outer substrates and outputting gate voltages to the plurality of pixels. Thus, even in a state in which the stretchable display device is stretched, the pixels can be normally driven.

19 Claims, 10 Drawing Sheets

STRETCHABLE DISPLAY DEVICE

CROSS-REFERENCE TO RELATED APPLICATIONS

This application claims the priority benefit of Korean Patent Application No. 10-2019-0119067 filed on Sep. 26, 2019, in the Korean Intellectual Property Office, the disclosure of which is incorporated herein by reference.

BACKGROUND

Technical Field

The present disclosure relates to a stretchable display device, and more particularly, to a stretchable display device allowing for a reduction in shrinkage of a display panel when the stretchable display device is stretched.

Description of the Related Art

Display devices used for a computer monitor, a TV, a mobile phone, and the like include an organic light emitting display (OLED) that emits light by itself, a liquid-crystal display (LCD) that requires a separate light source, and the like.

Such display devices are being applied to more and more various fields including not only a computer monitor and a TV, but personal mobile devices, and thus, display devices having a reduced volume and weight while having a wide display area are being studied.

Recently, a stretchable display device manufactured to be stretchable in a specific direction and changeable into various shapes by forming a display unit, lines, and the like on a flexible substrate such as plastic that is a flexible material has received considerable attention as a next-generation display device.

BRIEF SUMMARY

One or more embodiments of the present disclosure provides a stretchable display device including a gate driver capable of outputting a gate voltage when the stretchable display device is stretched.

One or more embodiments of the present disclosure provides a stretchable display device capable of stably supplying a driving voltage when the stretchable display device is stretched.

One or more embodiments of the present disclosure provides a stretchable display device capable of reducing stress concentrated in a non-display area when the stretchable display device is stretched.

Further embodiments of the present disclosure provides a stretchable display device allowing for a reduction in a bezel area of the stretchable display device.

Technical benefits or advantages of the present disclosure are not limited to the above-mentioned benefits, and other benefits, which are not mentioned above, can be clearly understood by those skilled in the art from the following descriptions.

According to an aspect of the present disclosure, a stretchable display device includes a lower substrate on which a display area displaying an image and a non-display area adjacent to the display area are defined; a plurality of pixel substrates disposed in the display area; a plurality of outer substrates disposed in the non-display area; a plurality of pixels disposed on the plurality of pixel substrates; and a plurality of gate drivers disposed on the plurality of outer substrates and outputting gate voltages to the plurality of pixels. Thus, even in a state in which the stretchable display device is stretched, the pixels can be normally driven.

According to another aspect of the present disclosure, a stretchable display device includes a stretchable substrate on which a display area displaying an image and a non-display area adjacent to the display area are defined; a plurality of first rigid substrates disposed in the display area; a plurality of second rigid substrates disposed in the non-display area; a plurality of pixels disposed on the plurality of first rigid substrates; a plurality of gate drivers disposed on the plurality of second rigid substrates and including a plurality of transistors; and a plurality of power supply units disposed on the plurality of second rigid substrates and connected to the plurality of gate drivers and the plurality of pixels. Thus, even when the stretchable display device is stretched, a driving voltage can be normally supplied.

Other detailed matters of the embodiments are included in the detailed description and the drawings.

According to the present disclosure, a gate driver and a power supply unit that are stretchable can be provided to thereby drive pixels of a stretchable display device.

According to the present disclosure, a size of a bezel area can be reduced by overlapping with the power supply unit and the gate driver.

According to the present disclosure, there are effects of improving adhesion between a substrate and a frame by disposing an adhesive material between the substrate and the structure.

According to the present disclosure, there are effects of reducing stress concentrated in a non-display area by uniformly forming curved-shaped connection substrates between outer substrates.

According to the present disclosure, a driving voltage can be stably supplied by configuring the power supply unit in a plate shape.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION OF EMBODIMENTS

Figure 1:
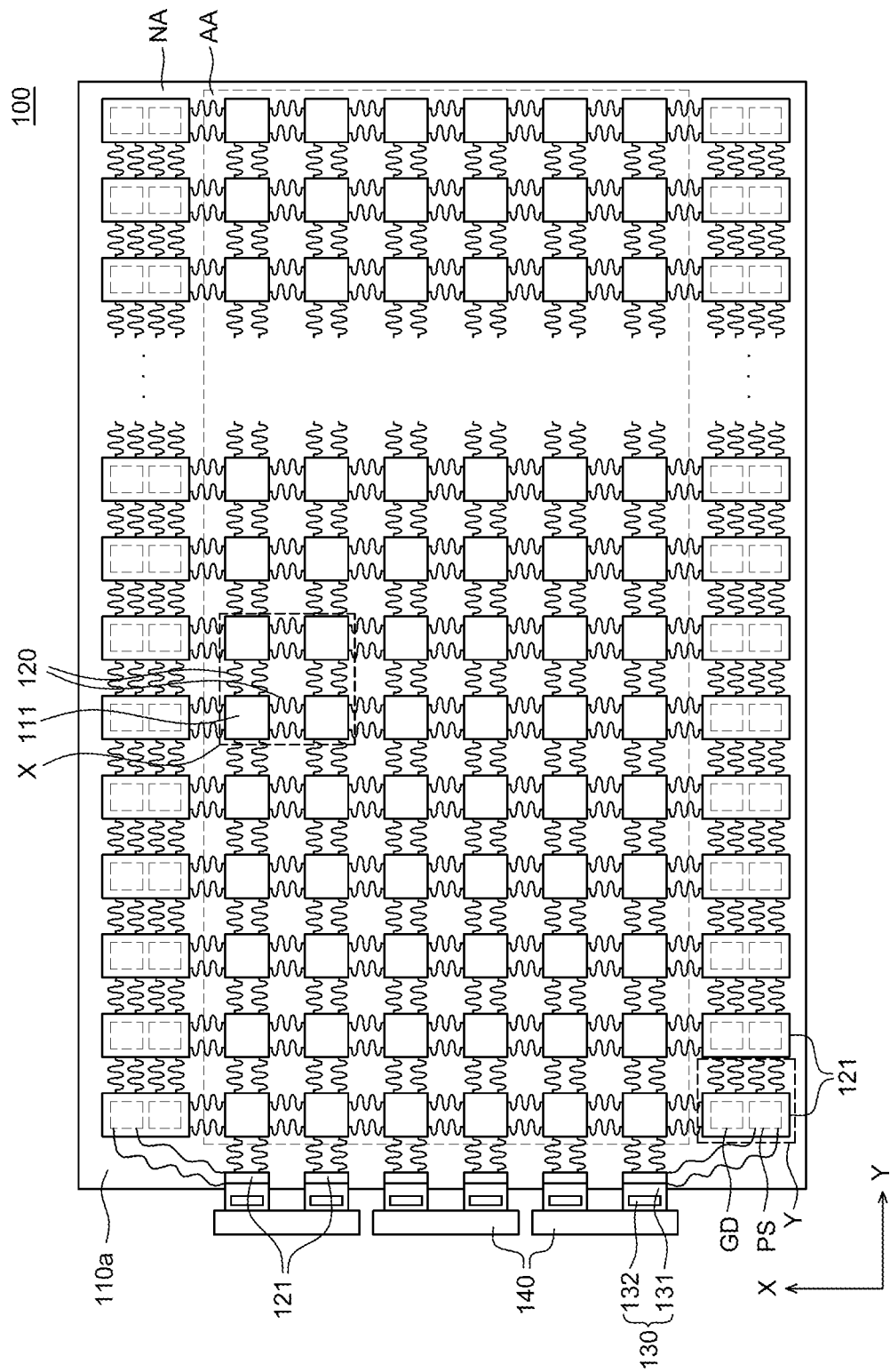
FIG. 1 is a schematic plan view of a stretchable display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a stretchable display device according to embodiments of the present disclosure will be described in detail with reference to accompanying drawings.
Stretchable Display Device A stretchable display device may refer to a display device capable of displaying images even it is bent or stretched. The stretchable display device may have higher flexibility than typical display devices. Thus, a shape of the stretchable display device can be freely deformed by a user's manipulation such as bending or stretching of the stretchable display device. For example, when the user seizes an end of the stretchable display device and pulls the stretchable display device, the stretchable display device can be stretched by force of the user. If the user places the stretchable display device on an uneven wall surface, the stretchable display device can be bent according to a shape of the wall surface. When the force applied by the user is removed, the stretchable display device can return to an original shape thereof. In addition, the shape of the stretchable display device may be bended, stretched, or extended to the extent or up to the threshold where the stretchable display device and its various components maintains its original features and functionality. When the force applied by the user exceeds this threshold, the display device may break and may not return to its original shape or contracted shape. In addition, the shape of the stretchable display device may be bended, stretched, or extended to the extent or up to the threshold where the stretchable display device and its various components maintains its original features and functionality. When the force applied by the user exceeds this threshold, the display device may break and may not return to its original shape or contracted shape.

FIG. 1 is a schematic plan view of a stretchable display device according to an embodiment of the present disclosure.

With reference to FIG. 1, a stretchable display device 100 includes a lower substrate 110a, a plurality of pixel substrates 111, a plurality of outer substrates 121, a plurality of connection substrates 120, a COF (Chip on Film) 130, and a printed circuit board 140.

The lower substrate 110a serves to protect and support various components of the stretchable display device 100. The lower substrate 110a is a flexible substrate and may be formed of a bendable or stretchable insulating material. For example, the lower substrate 110a may be formed of silicone rubber such as polydimethylsiloxane (PDMS) and an elastomer such as polyurethane (PU), and polytetrafluoroethylene (PTFE) or the like. Thus, the lower substrate 110a may have flexibility. However, materials of the lower substrate 110a are not limited thereto.

The lower substrate 110 is a soft substrate so as to be reversibly expanded and contracted. Further, an elastic modulus of the lower substrate 110 may be several MPa to several hundreds of MPa, for example, may be 0.7 MPa to 1 MPa. Further, a ductile breaking rate of the lower substrate 110 may be 100% or higher. Here, the ductile breaking rate refers to an extension distance when an object to be stretched is broken or cracked. That is, the ductile breaking rate is defined as a percentage ratio of a length of an original object and a length of the stretched object when an object has been stretched sufficiently that it is considered broken. For example, if a length of an object (e.g., lower substrate 110) is 100 cm when the object is not stretched and then, it reaches a length of 110 cm when the object has been stretched enough that it becomes broken or cracked at this length, then it was been stretched to 110% of its original length. In this case, the ductile breaking rate of the object is 110%. The number could thus also be called a ductile breaking ratio since it is a ratio of the stretched length as the numerator compared to the original upstretched length as the denominator at the time the break occurs.

The object is considered broken when it cannot longer function properly in the structure or circuit. For example, a wire that is a conductor would be considered broken when there is a sufficient degradation in its ability to carry current that it does not operate within the specifications of the circuit. Thus, in some embodiments, it might not require a full disconnection of the wire for it to be considered broken, a minor stress at a connection ends, a minor crack, a slight shift of the wire's location or other movement that causes it to no longer operate within its expected function would be considered a broken wire. If an insulator is stretched sufficiently that it no longer provides the amount of insulation needed for the structure or circuit, it would be considered broken. Breaking will also include in some embodiments a non-elastic stretching in which the object has been sufficiently stretched that it does not return to its original length and/or shape when it is no longer stretched. A thickness of the lower substrate 110a may be 10 µm to 1 mm, but is not limited thereto.

Meanwhile, the lower substrate 110a may include a display area AA and a non-display area NA surrounding the display area AA.

The display area AA refers to an area where images are displayed in the stretchable display device 100. In the display area AA, a light emitting element and various driving elements for driving the light emitting element are disposed. The display area AA includes a plurality of pixels including a plurality of sub-pixels. The plurality of pixels are disposed in the display area AA and include a plurality of light emitting devices. Each of the plurality of sub-pixels may be connected to various lines. For example, each of the plurality of sub-pixels may be connected to various lines such as a gate line, a data line, a high-potential pixel driving voltage line, a low-potential pixel driving voltage line, a reference voltage line, and the like.

The non-display area NA refers to an area adjacent to the display area AA. In some embodiments, the non-display area NA is adjacent to the display area AA and surrounds the display area AA. In the non-display area NA, images are not displayed, and lines and circuits may be disposed. For example, a plurality of pads may be disposed in the non-display area NA, and each of the pads may be connected to each of the plurality of sub-pixels disposed in the display area AA.

On the lower substrate 110a, the plurality of pixel substrates 111 and the plurality of outer substrates 121 are disposed. The plurality of pixel substrates 111 may be disposed in the display area AA of the lower substrate 110a, and the plurality of outer substrates 121 may be disposed in the non-display area NA of the lower substrate 110a. FIG. 1 illustrates that the plurality of outer substrates 121 in the non-display area NA are disposed on upper and lower sides and a left side of the display area AA. However, the present disclosure is not limited thereto. The plurality of outer substrates 121 may be disposed in any area of the non-display area NA.

The plurality of pixel substrates 111 and the plurality of outer substrates 121 are rigid substrates and independently disposed to be spaced apart from each other on the lower substrate 110a. That is, the pixel substrates 111 may be referred to as first rigid substrates and the outer substrates 121 may be referred to as second rigid substrates. The plurality of pixel substrates 111 and the plurality of outer substrates 121 may be more rigid than the lower substrate 110a. That is, the lower substrate 110a may be more ductile than the plurality of pixel substrates 111 and the plurality of outer substrates 121, and the plurality of pixel substrates 111 and the plurality of outer substrates 121 may be more rigid than the lower substrate 110a.

Each of the plurality of pixel substrates 111 and the plurality of outer substrates 121 as a plurality of rigid substrates may be formed of a plastic material having flexibility. The plurality of pixel substrates 111 and the plurality of outer substrates 121 may be formed of, for example, polyimide (PI), polyacrylate, polyacetate, or the like, but are not limited thereto. The plurality of pixel substrates 111 and the plurality of outer substrates 121 may be formed of a material different from those described above. In this case, the plurality of pixel substrates 111 may be formed of the same material as the plurality of outer substrates 121, but is not limited thereto. The pixel substrates 111 may also be formed of a different material from the plurality of outer substrates 121.

The plurality of pixel substrates 111 and the plurality of outer substrates 121 may have a higher modulus than that of the lower substrate 110a. Here, the modulus refers to an elastic modulus showing a ratio of deformation of a substrate to stress applied to the substrate, and when the modulus is relatively high, hardness may be relatively high. Therefore, the plurality of pixel substrates 111 and the plurality of outer substrates 121 may be a plurality of rigid substrates having a higher rigidity than the lower substrate 110a. The modulus of the plurality of pixel substrates 111 and the plurality of outer substrates 121 may be 1000 times or more than that of the lower substrate 110a, but is not limited thereto. For example, the elastic modulus of the pixel substrates 111 may be 2 GPa to 9 GPa depending on transparency thereof. More specifically, the elastic modulus is 2 GPa when the pixel substrates 111 are transparent, and the elastic modulus is 9 GPa when the pixel substrates 111 are opaque.

In some embodiments, the lower substrate 110a may be defined as including a plurality of first lower patterns and a second lower pattern. The plurality of first lower patterns may be disposed in an area of the lower substrate 110a which overlaps with the plurality of pixel substrates 111 and the plurality of outer substrates 121. Also, the second lower pattern may be disposed in an area excluding the area where the plurality of pixel substrates 111 and the plurality of outer substrates 121 are disposed. Otherwise, the second lower pattern may be disposed in the entire area of the stretchable display device 100.

In this case, the plurality of first lower patterns may have a higher modulus than that of the second lower pattern. For example, the plurality of first lower patterns may be formed of the same material as the plurality of pixel substrates 111. The second lower pattern may be formed of a material having a lower modulus than that of the plurality of pixel substrates 111.

The COF 130 is a flexible film formed by placing various components on a ductile base film 131 and is a component to supply signals to the plurality of sub-pixels in the display area AA. The COF 130 may be bonded to the plurality of pads disposed in the non-display area NA and supply a data voltage or the like to the plurality of respective sub-pixels through the pads. The COF 130 may supply a pixel driving voltage, a gate clock voltage, and a gate driving voltage to power supply circuits PS and gate drivers GD in the non-display area NA. The COF 130 may include the base film 131 and a drive IC 132 and may further include various components. The power supply circuits PS (which may be referred to herein as a power supply units PS) may include any electrical circuitry, features, components, an assembly of electronic components or the like configured to perform the various operations of the power supply features as described herein. In some embodiments, the power supply units PS may be included in or otherwise implemented by processing circuitry such as a microprocessor, microcontroller, integrated circuit, chip, microchip or the like.

The base film 131 serves to support the drive IC 132 of the COF 130. The base film 131 may be formed of an insulating material. For example, the base film 131 may be formed of an insulating material having flexibility.

The drive IC 132 is configured to process data for displaying an image and a drive signal for processing the data. FIG. 1 illustrates that the drive IC 132 is mounted by a method of the COF 130, but is not limited thereto. The drive IC 132 may also be mounted by a Chip On Glass (COG) method, a Tape Carrier Package (TCP) method or the like.

FIG. 1 illustrates that one outer substrate 121 is disposed in the non-display area NA on one side of the display area AA so as to correspond to the pixel substrates 111 in a row disposed in the display area AA, and one COF 130 is disposed for one outer substrate 121. However, the present disclosure is not limited thereto. That is, one outer substrate 121 and one COF 130 may be disposed so as to correspond to pixel substrates 111 in a plurality of rows.

In the printed circuit board 140, a control unit (or control circuitry) such as an IC chip, a circuit, or the like may be mounted. Further, in the printed circuit board 140, a memory, a processor, or the like may also be mounted. The printed circuit board 140 is configured to transfer a signal for driving the light emitting element from the control unit to the light emitting element. Although FIG. 1 illustrates that three printed circuit boards 140 are used, the number of printed circuit boards 140 is not limited thereto.

Hereinafter, the stretchable display device 100 according to an embodiment of the present disclosure will be described in more detail with reference to FIGS. 2 to 3.

Planar and Cross-Sectional Structures

Figure 2:
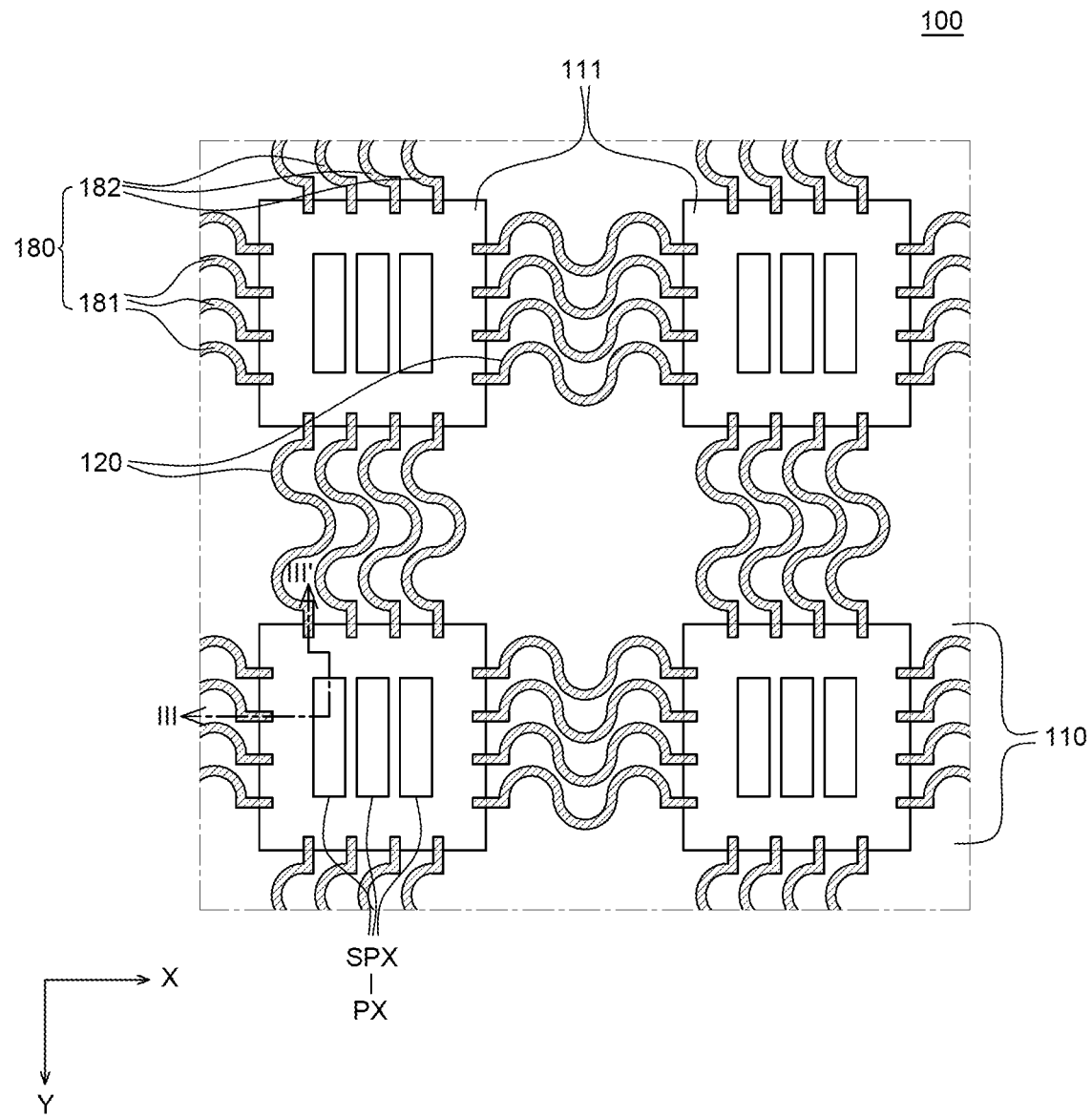
FIG. 2 is an enlarged plan view of region λ illustrated in FIG. 1.

FIG. 2 is an enlarged plan view of region X illustrated in FIG. 1. FIG. 3 is a cross-sectional view taken along line of FIG. 2.

With reference to FIGS. 1 and 2, the plurality of pixel substrates 111 are disposed on the lower substrate 110a in the display area AA. The plurality of pixel substrates 111 are disposed on the lower substrate 110a to be spaced apart from each other. For example, the plurality of pixel substrates 111 may be disposed in a matrix form on the lower substrate 110a as shown in FIGS. 1 and 2, but are not limited thereto.

With reference to FIGS. 1 and 2, a plurality of sub-pixels SPX constituting a plurality of pixels PX may be disposed in the plurality of pixel substrates 111. In addition, the gate drivers GD and the power supply units PS may be mounted on the outer substrates 121 located at both sides in an X-axis direction among the plurality of outer substrates 121.

The gate drivers GD may be formed on the outer substrates 121 in a gate-in panel (GIP) manner. More specifically, one stage of the gate driver GD may be disposed on each of the plurality of outer substrates 121. Accordingly, various circuit components constituting one stage of the gate driver GD, such as various transistors, capacitors, lines and the like may be disposed on the plurality of outer substrates 121.

In addition, respective stages of the gate drivers GD formed on the outer substrates 121 may be electrically connected to each other. That is, respective stages of the gate drivers GD formed on the outer substrates 121 are electrically connected to each other to thereby transfer a gate voltage output from any one stage to another stage connected to the one stage. A concrete driving method of the gate drivers D will be described later with reference to FIG. 4.

However, the gate drivers GD are not limited to being mounted in the gate in panel (GIP) manner, and the gate drivers GD may be mounted in a chip on film (COF) manner.

Also, the power supply units PS may be formed on the outer substrates 121. In other words, the power supply units PS may be formed adjacent to the gate drivers GD on the outer substrates 121.

In addition, the power supply units PS are connected to the gate drivers GD to supply a gate driving voltage and a gate clock voltage. In addition, the power supply units PS are connected to the plurality of pixels PX to supply a pixel driving voltage to each of the plurality of pixels PX.

In addition, the respective power supply units PS formed on the plurality of outer substrates 121 may be electrically connected to each other. That is, a plurality of the power supply units PS formed on the plurality of outer substrates 121 may be connected to each other by a gate power connection line and a pixel power connection line. Accordingly, each of the plurality of power supply units PS may supply the gate driving voltage, the gate clock voltage, and the pixel driving voltage through the gate power connection line and the pixel power connection line.

A concrete connection relationship of the power supply units PS will be described later with reference to FIGS. 5A to 9.

Meanwhile, with reference to FIG. 1, the plurality of outer substrates 121 may have a size greater than that of the plurality of pixel substrates 111. Specifically, each of the plurality of outer substrates 121 may have a size greater than that of each of the plurality of pixel substrates 111. As described above, the gate driver GD and the power supply unit PS are disposed on each of the plurality of outer substrates 121. Accordingly, since an area occupied by the gate driver GD and the power supply unit PS is relatively greater than an area of the pixel substrate 111 on which the pixel PX is disposed, the size of each of the plurality of outer substrates 121 may be greater than the size of each of the plurality of pixel substrates 111.

With reference to FIGS. 1 and 2, the plurality of connection substrates 120 may be disposed between the plurality of pixel substrates 111 or between the plurality of outer substrates 121. Otherwise, the plurality of connection substrates 120 may be disposed between the plurality of pixel substrates 111 and the plurality of outer substrates 121. The plurality of connection substrates 120 serve to connect the pixel substrates 111 adjacent to each other, the outer substrates 121 adjacent to each other, or the pixel substrates 111 and the outer substrates 121 to each other. The plurality of connection substrates 120 may be formed of the same material as the pixel substrates 111 or the outer substrates 121 and may be formed integrally with the pixel substrates 111 or the outer substrates 121 at the same time. However, the present disclosure is not limited thereto.

With reference to FIG. 2, the plurality of connection substrates 120 have a curved shape. For example, as shown in FIG. 2, the plurality of connection substrates 120 may have a sine wave shape. However, the shape of the plurality of connection substrates 120 is not limited thereto. The plurality of connection substrates 120 may be variously shaped. For example, the plurality of connection substrates 120 may extend in a zigzag manner, or a plurality of diamond-shaped substrates may be extended by being connected to each other at their vertices. The number and shape of the plurality of connection substrates 120 shown in FIG. 2 is provided by way of example. The number and shape of the plurality of connection substrates 120 may vary depending on the design thereof.

Figure 3:
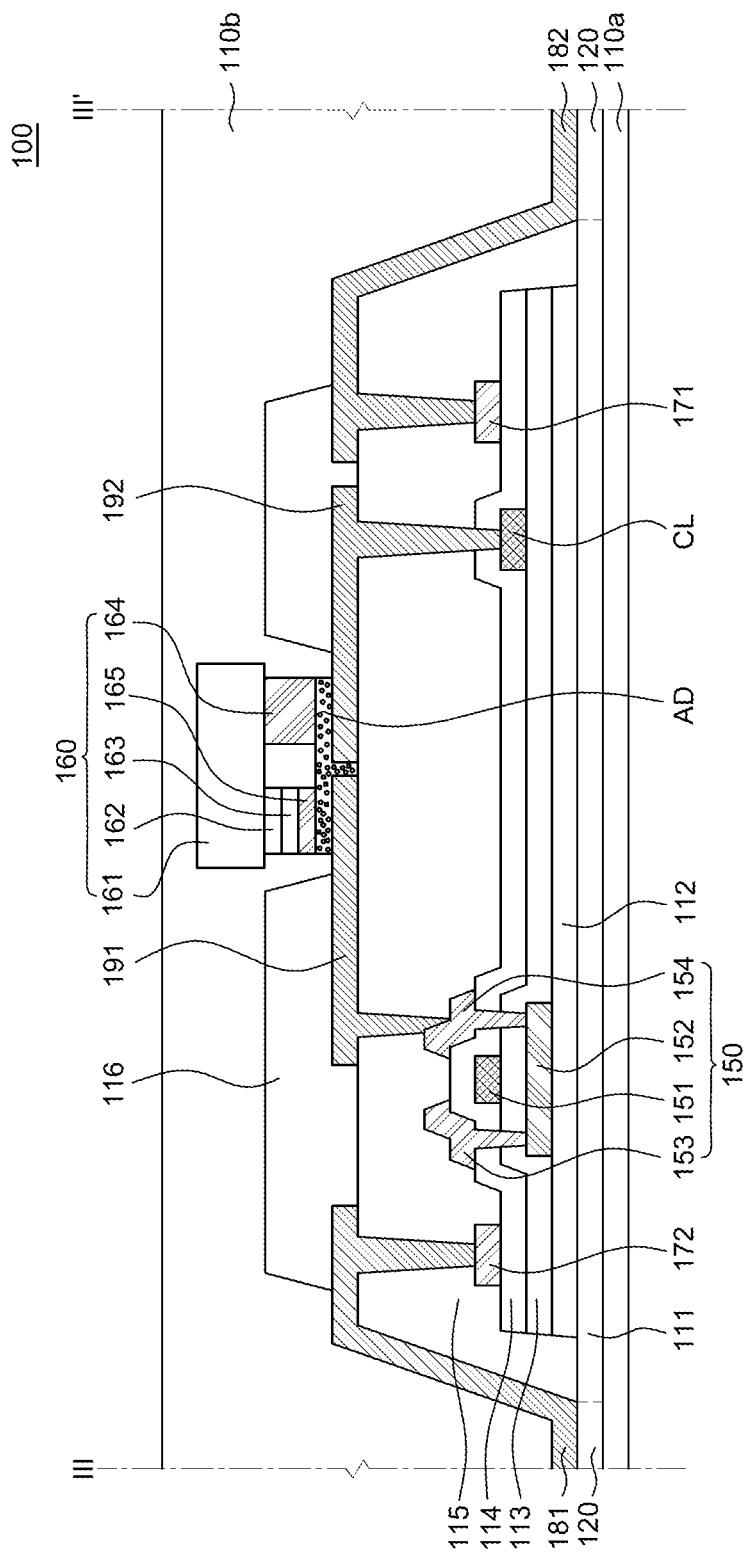
FIG. 3 is a cross-sectional view taken along line of FIG. 2.

With reference to FIG. 3, a plurality of inorganic insulating layers are disposed on the plurality of pixel substrates 111. For example, the plurality of inorganic insulating layers may include a buffer layer 112, a gate insulating layer 113, and an interlayer insulating layer 114, but are not limited thereto. Various inorganic insulating layers may be additionally disposed on the plurality of pixel substrates 111, or one or more of the buffer layer 112, the gate insulating layer 113, and the interlayer insulating layer 114 may be omitted.

With reference to FIG. 3, the buffer layer 112 is disposed on the plurality of pixel substrates 111. The buffer layer 112 is formed on the plurality of pixel substrates 111 to protect various components of the stretchable display device 100 against permeation of moisture ($H_2O$), oxygen ($O_2$), and the like from the outside of the lower substrate 110a and the plurality of pixel substrates 111. The buffer layer 112 may be formed of an insulating material. For example, the buffer layer 112 may be formed of a single inorganic layer or multiple inorganic layers of silicon nitride (SiNx), silicon oxide (SiOx), silicon oxynitride (SiON), or the like. However, the buffer layer 112 may be omitted depending on a structure or characteristics of the stretchable display device 100.

In this case, the buffer layer 112 may be formed only in an area overlapping with the plurality of pixel substrates 111 and the plurality of outer substrates 121. As described above, the buffer layer 112 may be formed of an inorganic material. Thus, the buffer layer 112 may be easily damaged, for example, may easily crack, while the stretchable display device 100 is stretched. Therefore, the buffer layer 112 may not be formed in areas between the plurality of pixel substrates 111 and the plurality of outer substrates 121. The buffer layer 112 may be patterned into shapes of the plurality of pixel substrates 111 and the plurality of outer substrates 121 and formed only on upper portions of the plurality of pixel substrates 111 and the plurality of outer substrates 121. Accordingly, in the stretchable display device 100 according to an embodiment of the present disclosure, the buffer layer 112 is formed only in the area overlapping with the plurality of pixel substrates 111 and the plurality of outer substrates 121 which are rigid substrates. Thus, it is feasible to prevent damage to the buffer layer 112 even when the stretchable display device 100 is deformed, such as being bent or stretched.

With reference to FIG. 3, a transistor 150 including a gate electrode 151, an active layer 152, a source electrode 153, and a drain electrode 154 is formed on the buffer layer 112.

First, with reference to FIG. 3, the active layer 152 is disposed on the buffer layer 112. For example, the active layer 152 may be formed of an oxide semiconductor or may be formed of amorphous silicon (a-Si), polycrystalline silicon (poly-Si), an organic semiconductor, or the like.

The gate insulating layer 113 is disposed on the active layer 152. The gate insulating layer 113 serves as a layer for electrically insulating the gate electrode 151 and the active layer 152 and may be formed of an insulating material. For example, the gate insulating layer 113 may be formed of a single layer or multiple layers of silicon nitride (SiNx) or silicon oxide (SiOx) which is an inorganic material, but is not limited thereto.

The gate electrode 151 is disposed on the buffer layer 112. The gate electrode 151 is disposed to overlap with the active layer 152. The gate electrode 151 may be formed of any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof, but is not limited thereto.

The interlayer insulating layer 114 is disposed on the gate electrode 151. The interlayer insulating layer 114 serves to insulate the gate electrode 151 from the source electrode 153 and the drain electrode 154 and may be formed of an inorganic material like the buffer layer 112. For example, the interlayer insulating layer 114 may be formed of a single layer or multiple layers of silicon nitride (SiNx) or silicon oxide (SiOx) which is an inorganic material, but is not limited thereto.

The source electrode 153 and the drain electrode 154 in contact with the active layer 152 are disposed on the interlayer insulating layer 114. The source electrode 153 and the drain electrode 154 are disposed on the same layer to be spaced apart from each other. The source electrode 153 and the drain electrode 154 may be electrically connected to the active layer 152 to be in contact with the active layer 152. The source electrode 153 and the drain electrode 154 may be formed of one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof.

Further, the gate insulating layer 113 and the interlayer insulating layer 114 may be patterned and formed only in an area overlapping with the plurality of pixel substrates 111. The gate insulating layer 113 and the interlayer insulating layer 114 may also be formed of an inorganic material like the buffer layer 112. Thus, the gate insulating layer 113 and the interlayer insulating layer 114 may be easily damaged, for example, may easily crack, while the stretchable display device 100 is stretched. Therefore, the gate insulating layer 113 and the interlayer insulating layer 114 may not be formed in areas between the plurality of pixel substrates 111. The gate insulating layer 113 and the interlayer insulating layer 114 may be patterned into the shape of the plurality of pixel substrates 111 and formed only on the plurality of pixel substrates 111.

For convenience of explanation, FIG. 3 illustrates only a driving transistor among various transistors which can be included in the stretchable display device 100. However, a switching transistor, a capacitor and the like can also be included in the stretchable display device. Further, in the present disclosure, the transistor 150 is described as having a coplanar structure, but various types of transistor having a staggered structure and the like may also be used.

With reference to FIG. 3, a plurality of pads (e.g., at least one gate pad 171 and at least one data pad 172 . . . ) are disposed on the interlayer insulating layer 114. Specifically, a gate pad 171 among the plurality of pads is disposed on the interlayer insulating layer 114. The gate pad 171 serves to transfer gate voltages to the plurality of sub-pixels SPX. The gate voltage may be transferred from the gate pad 171 to the gate electrode 151 through a gate line formed on the pixel substrate 111. The gate pad 171 may be formed of the same material as the source electrode 153 and the drain electrode 154, but is not limited thereto.

With reference to FIG. 3, a data pad 172 among the plurality of pads is disposed on the interlayer insulating layer 114. The data pad 172 serves to transfer data voltages to the plurality of sub-pixels SPX. The data voltage may be transferred from the data pad 172 to the source electrode 153 or the drain electrode 154 through a data line formed on the pixel substrate 111. The data pad 172 may be formed of the same material as the source electrode 153 and the drain electrode 154, but is not limited thereto.

With reference to FIG. 3, a planarization layer 115 is formed on the transistor 150 and the interlayer insulating layer 114. The planarization layer 115 serves to flatten an upper portion of the transistor 150. The planarization layer 115 may be formed of a single layer or multiple layers and formed of an organic material. For example, the planarization layer 115 may be formed of an acrylic organic material, but is not limited thereto.

With reference to FIG. 3, the planarization layer 115 is disposed on the plurality of pixel substrates 111 to cover upper and side surfaces of the buffer layer 112, the gate insulating layer 113, and the interlayer insulating layer 114. Accordingly, the planarization layer 115 surrounds or partially surrounds the buffer layer 112, the gate insulating layer 113, and the interlayer insulating layer 114, together with the plurality of pixel substrates 111. Specifically, the planarization layer 115 may be disposed to cover an upper surface and a side surface of the interlayer insulating layer 114, a side surface of the gate insulating layer 113, a side surface of the buffer layer 112, and a portion of upper surfaces of the plurality of pixel substrates 111. Thus, the planarization layer 115 may compensate for steps between the side surfaces of the buffer layer 112, the gate insulating layer 113, and the interlayer insulating layer 114. Also, the planarization layer 115 may enhance adhesion strength between the planarization layer 115 and pixel connection lines 180 disposed on a side surface of the planarization layer 115.

With reference to FIG. 3, an incline angle of the side surface of the planarization layer 115 may be lower than those of the side surfaces of the buffer layer 112, the gate insulating layer 113, and the interlayer insulating layer 114. For example, the side surface of the planarization layer 115 may have an inclination lower than those of the side surface of the interlayer insulating layer 114, the side surface of the gate insulating layer 113, and the side surface of the buffer layer 112. Thus, the pixel connection lines 180 in contact with the side surface of the planarization layer 115 are disposed to have a low inclination. Therefore, when the stretchable display device 100 is stretched, stress generated in the pixel connection lines 180 can be reduced. Also, it is feasible to suppress cracks in the pixel connection lines 180 or peeling of the pixel connection lines 180 from the side surface of the planarization layer 115.

In some embodiments, a passivation layer may be formed between the transistor 150 and the planarization layer 115. That is, the passivation layer covering the transistor 150 may be formed to protect the transistor 150 from permeation of moisture, oxygen, and the like. The passivation layer may be formed of an inorganic material and formed of a single layer or multiple layers, but is not limited thereto.

With reference to FIG. 3, a common line CL is disposed on the gate insulating layer 113. The common line CL serves to apply a common voltage to the plurality of sub-pixels SPX. The common line CL may be formed of the same material as the gate electrode 151 of the transistor 150, but is not limited thereto.

With reference to FIGS. 2 and 3, the pixel connection lines 180 mean lines that electrically connect the plurality of pixels PX disposed on the pixel substrates 111. The pixel connection lines 180 are disposed on the pixel substrates 111 and the plurality of connection substrates 120.

The pixel connection lines 180 include first pixel connection lines 181 and second pixel connection lines 182. The first pixel connection lines 181 and the second pixel connection lines 182 are disposed between the plurality of pixel substrates 111. Specifically, the first pixel connection lines 181 refer to lines extending in the X-axis direction between the plurality of pixel substrates 111 among the pixel connection lines 180. The second pixel connection lines 182 refer to lines extending in a Y-axis direction between the plurality of pixel substrates 111 among the pixel connection lines 180.

The pixel connection lines 180 may be formed of a metal material such as copper (Cu), aluminum (Al), titanium (Ti), or molybdenum (Mo). Otherwise, the pixel connection lines 180 may have a stacked structure of metal materials such as copper/molybdenum-titanium (Cu/MoTi), titanium/aluminum/titanium (Ti/Al/Ti), or the like, but are not limited thereto.

In a general organic light emitting display device, various lines such as a plurality of gate lines and a plurality of data lines extend in straight lines and are disposed between a plurality of sub-pixels. Also, the plurality of sub-pixels are connected to a single signal line. Therefore, in the general organic light emitting display device, various lines such as a gate line, a data line, a high-potential pixel driving voltage line and a reference voltage line, continuously extend on a substrate from one side to the other side of the organic light emitting display device.

Unlike this, in the stretchable display device 100 according to an embodiment of the present disclosure, various lines such as a gate line, a data line, and a reference voltage line which are formed in straight lines and considered to be used in the general organic light emitting display device, are disposed only on the plurality of pixel substrates 111 and the plurality of outer substrates 121. That is, in the stretchable display device 100 according to an embodiment of the present disclosure, lines formed in straight lines are disposed only on the plurality of pixel substrates 111 and the plurality of outer substrates 121.

In the stretchable display device 100 according to an embodiment of the present disclosure, the pads on two adjacent pixel substrates 111 or one pixel substrate 111 and one outer substrate 121 adjacent to each other may be connected by the pixel connection lines 180, so as to connect discontinuous lines on the pixel substrates 111 or outer substrates 121. That is, the pixel connection lines 180 electrically connect the pads on the two adjacent pixel substrates 111 and the adjacent pixel substrate 111 and outer substrate 121. Therefore, the stretchable display device 100 according to an embodiment of the present disclosure may include the plurality of pixel connection lines 180 so as to electrically connect various lines, such as a gate line, a data line, and a reference voltage line, between the plurality of pixel substrates 111 and between the plurality of pixel substrates 111 and the plurality of outer substrates 121. For example, gate lines may be disposed on the plurality of pixel substrates 111 disposed adjacent to each other in the X-axis direction and the gate pads 171 may be disposed on both ends of the gate lines. In this case, a plurality of gate pads 171 on the plurality of pixel substrates 111 disposed adjacent to each other in the X-axis direction may be connected to each other by the first pixel connection lines 181 serving as the gate lines. Therefore, the gate lines disposed on the plurality of pixel substrates 111 and the first pixel connection lines 181 disposed on the outer substrates 121 may serve as a single gate line. Further, lines, for example, a light emission signal line, a low-potential pixel driving voltage line, and a high-potential pixel driving voltage line, which extend in the X-axis direction among all of various lines capable of being included in the stretchable display device 100, may also be electrically connected by the first pixel connection lines 181 as described above.

With reference to FIGS. 2 and 3, the first pixel connection lines 181 may connect pads on two pixel substrates 111 disposed side by side among the pads on the plurality of pixel substrates 111 disposed adjacent to each other in the X-axis direction. The first pixel connection line 181 may serve as a gate line, a light emission signal line, a high-potential pixel driving voltage line, or a low-potential pixel driving voltage line, but is not limited thereto. For example, the first pixel connection line 181 may serve as a gate line and electrically connect the gate pads 171 on the two pixel substrates 111 disposed side by side in the X-axis direction. Therefore, as described above, the gate pads 171 on the plurality of pixel substrates 111 disposed in the X-axis direction may be connected by the first pixel connection lines 181 serving as the gate lines. A single gate signal may be transferred to the gate pads 171.

With reference to FIG. 2, the second pixel connection lines 182 may connect the pads on two pixel substrates 111 disposed side by side among the pads on the plurality of pixel substrates 111 disposed adjacent to each other in the Y-axis direction. The second pixel connection line 182 may serve as a data line or a reference voltage line, but is not limited thereto. For example, the second pixel connection line 182 may serve as a data line and electrically connect data lines on two pixel substrates 111 disposed side by side in the Y-axis direction. Therefore, as described above, the data lines on the plurality of pixel substrates 111 disposed in the Y-axis direction may be connected by a plurality of the second pixel connection lines 182 serving as data lines. A single data signal may be transferred to the data lines.

With reference to FIG. 1, the pixel connection lines 180 may further include a line that connect the pads on the plurality of pixel substrates 111 and the plurality of outer substrates 121

The first pixel connection line 181 is in contact with an upper surface and the side surface of the planarization layer 115 disposed on the pixel substrate 111 and may extend to an upper surface of the connection substrate 120. Also, the second pixel connection line 182 is in contact with the upper surface and the side surface of the planarization layer 115 disposed on the pixel substrate 111 and may extend to the upper surface of the connection substrate 120. Arrangements and resultant effects of the first pixel connection line 181 and the second pixel connection line 182 will be described later in detail.

With reference to FIG. 3, a bank 116 is formed on a first connection pad 191, a second connection pad 192, the pixel connection lines 180, and the planarization layer 115. The bank 116 is a component to distinguish the sub-pixels SPX adjacent from each other.

The bank 116 is disposed to cover a portion of the first connection pad 191 and the second pixel connection line 182 adjacent thereto or at least a portion of the second connection pad 192 and the first pixel connection line 181 adjacent thereto. The bank 116 may be formed of an insulating material. Further, the bank 116 may include a black material. Since the bank 116 includes a black material, the bank 116 serves to hide lines which are visible through the display area AA. The bank 116 may be formed of, for example, a transparent carbon-based mixture. Specifically, the bank 116 may include carbon black, but is not limited thereto. The bank 116 may also be formed of a transparent insulating material.

With reference to FIG. 3, an LED 160 is disposed on the first connection pad 191 and the second connection pad 192. The LED 160 includes an n-type layer 161, an active layer 162, a p-type layer 163, an n-electrode 164, and a p-electrode 165. The LED 160 of the stretchable display device 100 according to an embodiment of the present disclosure has a flip-chip structure in which the n-electrode 164 and the p-electrode 165 are formed on one surface thereof.

The n-type layer 161 may be formed by injecting n-type impurities into gallium nitride (GaN) having excellent crystallinity. The n-type layer 161 may be disposed on a separate base substrate which is formed of a light emitting material.

The active layer 162 is disposed on the n-type layer 161. The active layer 162 is a light emitting layer that emits light in the LED 160 and may be formed of a nitride semiconductor, for example, indium gallium nitride (InGaN). The p-type layer 163 is disposed on the active layer 162. The p-type layer 163 may be formed by injecting p-type impurities into gallium nitride (GaN).

The LED 160 according to an embodiment of the present disclosure is manufactured by sequentially stacking the n-type layer 161, the active layer 162, and the p-type layer 163, and then, etching a predetermined area of the layers to thereby form the n-electrode 164 and the p-electrode 165. In this case, the predetermined area is a space to separate the n-electrode 164 and the p-electrode 165 from each other and is etched to expose a portion of the n-type layer 161. In other words, surfaces of the LED 160 on which the n-electrode 164 and the p-electrode 165 are to be disposed may not be flat and may have different levels of height.

The n-electrode 164 is disposed on the etched area, i.e., on the n-type layer 161 which is exposed by etching. The n-electrode 164 may be formed of a conductive material. Meanwhile, the p-electrode 165 is disposed on a non-etched area, i.e., on the p-type layer 163. The p-electrode 165 may be formed of a conductive material. For example, the p-electrode 165 may be formed of the same material as the n-electrode 164.

An adhesive layer AD is disposed on upper surfaces of the first connection pad 191 and the second connection pad 192 and between the first connection pad 191 and the second connection pad 192. Thus, the LED 160 can be bonded onto the first connection pad 191 and the second connection pad 192. In this case, the n-electrode 164 may be disposed on the second connection pad 192 and the p-electrode 165 may be disposed on the first connection pad 191.

The adhesive layer AD may be a conductive adhesive layer formed by dispersing conductive balls in an insulating base member. Thus, when heat or pressure is applied to the adhesive layer AD, the conductive balls are electrically connected to have conductive properties in a portion of the adhesive layer AD to which heat or pressure is applied. And, an area of the adhesive layer AD to which pressure is not applied may have insulating properties. For example, the n-electrode 164 is electrically connected to the second pixel connection line 182 through the adhesive layer AD, and the p-electrode 165 is electrically connected to the first pixel connection line 181 through the adhesive layer AD. That is, after applying the adhesive layer AD to the first connection pad 191 and the second connection pad 192 by an inkjet method or the like, the LED 160 may be transferred onto the adhesive layer AD. Then, the LED 160 may be pressed and heated to thereby electrically connect the first connection pad 191 to the p-electrode 165 and the second connection pad 192 to the n-electrode 164. However, other portions of the adhesive layer AD excluding a portion of the adhesive layer AD between the n-electrode 164 and the second connection pad 192 and a portion of the adhesive layer AD between the p-electrode 165 and the first connection pad 191 have insulating properties. Meanwhile, the adhesive layer AD may be separately disposed on each of the first connection pad 191 and the second connection pad 192.

As described above, the stretchable display device 100 according to an embodiment of the present disclosure has a structure in which the LED 160 is disposed on the lower substrate 110a in which the transistor 150 is disposed. Thus, when the stretchable display device 100 is turned on, different levels of voltage applied to each of the first connection pad 191 and the second connection pad 192 are transferred to the n-electrode 164 and the p-electrode 165, so that the LED 160 emits light.

With reference to FIG. 3, a stretchable upper substrate 110b is disposed on the bank 116, the LED 160, and the lower substrate 110a.

The stretchable upper substrate 110b serves to support various components disposed under the stretchable upper substrate 110b. The stretchable upper substrate 110b is a flexible substrate and may be formed of a bendable or stretchable insulating material. For example, the stretchable upper substrate 110b may be formed of a material having flexibility, and may be formed of the same material as the lower substrate 110a, but is not limited thereto. Specifically, the stretchable upper substrate 110b may be formed by coating and hardening a material configuring the stretchable upper substrate 110b on the lower substrate 110a and the pixel substrates 111. Thus, the stretchable upper substrate 110b may be disposed to be in contact with the lower substrate 110a, the pixel substrates 111, the connection substrates 120, and the pixel connection lines 180.

The stretchable upper substrate 110b is a flexible substrate and may be formed of a bendable or stretchable insulating material. The stretchable upper substrate 110b is a flexible substrate and may be reversibly expandable and contractible. Further, the stretchable upper substrate 110b may have an elastic modulus of several MPa to several hundreds of MPa. In addition, the stretchable upper substrate 110b may have a ductile breaking rate of 100% or more. A thickness of the stretchable upper substrate 110b may be from 10 µm to 1 mm, but is not limited thereto.

The stretchable upper substrate 110b may be formed of the same material as the lower substrate 110a. For example, the stretchable upper substrate 110b may be formed of silicone rubber such as polydimethylsiloxane (PDMS) and an elastomer such as polyurethane (PU), and polytetrafluoroethylene (PTFE) or the like. Thus, the stretchable upper substrate 110b may have flexibility. However, the materials of the stretchable upper substrate 110b are not limited thereto.

Meanwhile, although not illustrated in FIG. 3, a polarizing layer may also be disposed on the stretchable upper substrate 110b. The polarizing layer polarizes light incident from the outside of the stretchable display device 100 and reduces reflection of external light. Further, instead of the polarizing layer, other optical films or the like may be disposed on the stretchable upper substrate 110b.

In a conventional stretchable display device, a planarization layer formed of an organic insulating material does not cover side surfaces of a plurality of inorganic insulating layers including a buffer layer, a gate insulating layer, and an interlayer insulating layer. Instead, the planarization layer is disposed on the plurality of inorganic insulating layers. Thus, connection lines are disposed to be in contact with the side surfaces of the plurality of inorganic insulating layers. However, when a patterning process, i.e., an etching process, is performed on the plurality of inorganic insulating layers, a step between the side surfaces of the plurality of inorganic insulating layers may occur. That is, the side surfaces of the plurality of inorganic insulating layers have significantly high inclinations after the etching process. Therefore, if connection lines are formed directly on the side surfaces of the plurality of inorganic insulating layers, the connection lines may be shorted.

Therefore, in the stretchable display device 100 according to an embodiment of the present disclosure, the planarization layer 115 is disposed to cover the side surfaces of the buffer layer 112, the gate insulating layer 113, and the interlayer insulating layer 114. Thus, when the stretchable display device 100 is stretched repeatedly, it is feasible to suppress peeling of the pixel connection lines 180 from the planarization layer 115 and the side surfaces of the plurality of inorganic insulating layers. More specifically, the pixel connection lines 180 formed of Cu or other low-resistance metal materials are disposed on the upper surface and the side surface of the planarization layer 115 formed of an organic insulating material. Thus, the adhesion strength of lower portions of the pixel connection lines 180 can be enhanced. Therefore, in the stretchable display device 100 according to an embodiment of the present disclosure, the planarization layer 115 is disposed to cover the side surfaces of the plurality of inorganic insulating layers, such as the buffer layer 112, the gate insulating layer 113, and the interlayer insulating layer 114, on the pixel substrate 111. Thus, when the stretchable display device 100 is stretched repeatedly, it is feasible to suppress peeling of the pixel connection lines 180 from the planarization layer 115. Therefore, the reliability of the stretchable display device 100 can be improved. In addition, in the stretchable display device 100 according to an embodiment of the present disclosure, the planarization layer 115 is disposed to cover the side surfaces of the plurality of inorganic insulating layers, such as the buffer layer 112, the gate insulating layer 113, and the interlayer insulating layer 114, between the pixel substrates 111 and the planarization layer 115. Thus, the planarization layer 115 can compensate for steps between the side surfaces of the buffer layer 112, the gate insulating layer 113, and the interlayer insulating layer 114. That is, the planarization layer 115 is disposed to cover the upper surfaces and the side surfaces of the buffer layer 112, the gate insulating layer 113, and the interlayer insulating layer 114. Also, an incline angle of the side surface of the planarization layer 115 may be lower than incline angles of the side surfaces of the buffer layer 112, the gate insulating layer 113, and the interlayer insulating layer 114. That is, the side surface of the planarization layer 115 may have a slope gentler than those of the side surface of the interlayer insulating layer 114, the side surface of the gate insulating layer 113, and the side surface of the buffer layer 112. Thus, the pixel connection lines 180 in contact with the side surface of the planarization layer 115 are disposed at a gentle slope. Therefore, when the pixel connection lines 180 are formed, the occurrence of cracks in the pixel connection lines 180 can be suppressed. Also, when the stretchable display device 100 is stretched, stress generated in the pixel connection lines 180 can be reduced. Further, it is feasible to suppress cracks in the pixel connection lines 180 or peeling of the pixel connection lines 180 from the side surface of the planarization layer 115.

Further, in the stretchable display device 100 according to an embodiment of the present disclosure, the pixel connection lines 180 may have the same shape as the connection substrate 120 and thus may have a sine wave shape. Therefore, a resistance of the pixel connection lines 180 may increase compared to the case where the pixel connection lines 180 have a straight-line shape. Accordingly, copper (Cu) having low resistance among various metal materials which can be used for lines may be used in the pixel connection lines 180 so as to reduce the resistance of the pixel connection lines 180. However, when Cu or other low-resistance metal materials are formed on an inorganic insulating layer, adhesion strength between the metal materials and the inorganic insulating layer may be problematic. That is, Cu or other low-resistance metal materials have small adhesion strength with respect to the inorganic insulating layer. Thus, if the pixel connection lines 180 are disposed to be in contact with side portions of the plurality of inorganic insulating layers such as the buffer layer 112, the gate insulating layer 113, and the interlayer insulating layer 114, the pixel connection lines 180 may peel off from the side surfaces of the buffer layer 112, the gate insulating layer 113, and the interlayer insulating layer 114 when the stretchable display device 100 is stretched. Therefore, the reliability of the stretchable display device 100 may be degraded.

Further, in the stretchable display device 100 according to an embodiment of the present disclosure, the planarization layer 115 is disposed on the plurality of inorganic insulating layers, such as the buffer layer 112, the gate insulating layer 113, and the interlayer insulating layer 114, and the transistor 150. Thus, when the LED 160 is transferred, it is feasible to protect components disposed under the planarization layer 115. When the LED 160 is disposed on the stretchable display device 100, the LED 160 may be pressed from above the stretchable display device 100. In this case, the transistor 150, various lines, and the connection lines 180 disposed under the LED 160 may be damaged by pressure. Therefore, the planarization layer 115 is disposed on the buffer layer 112, the gate insulating layer 113, the interlayer insulating layer 114, and the transistor 150. Accordingly, when the LED 160 is transferred, stress caused by pressing can be reduced. Thus, damage to the transistor 150, various lines, the connection lines 180, and the like, disposed under the planarization layer 115 can be reduced.

Driving Method of Gate Driver

Figure 4:
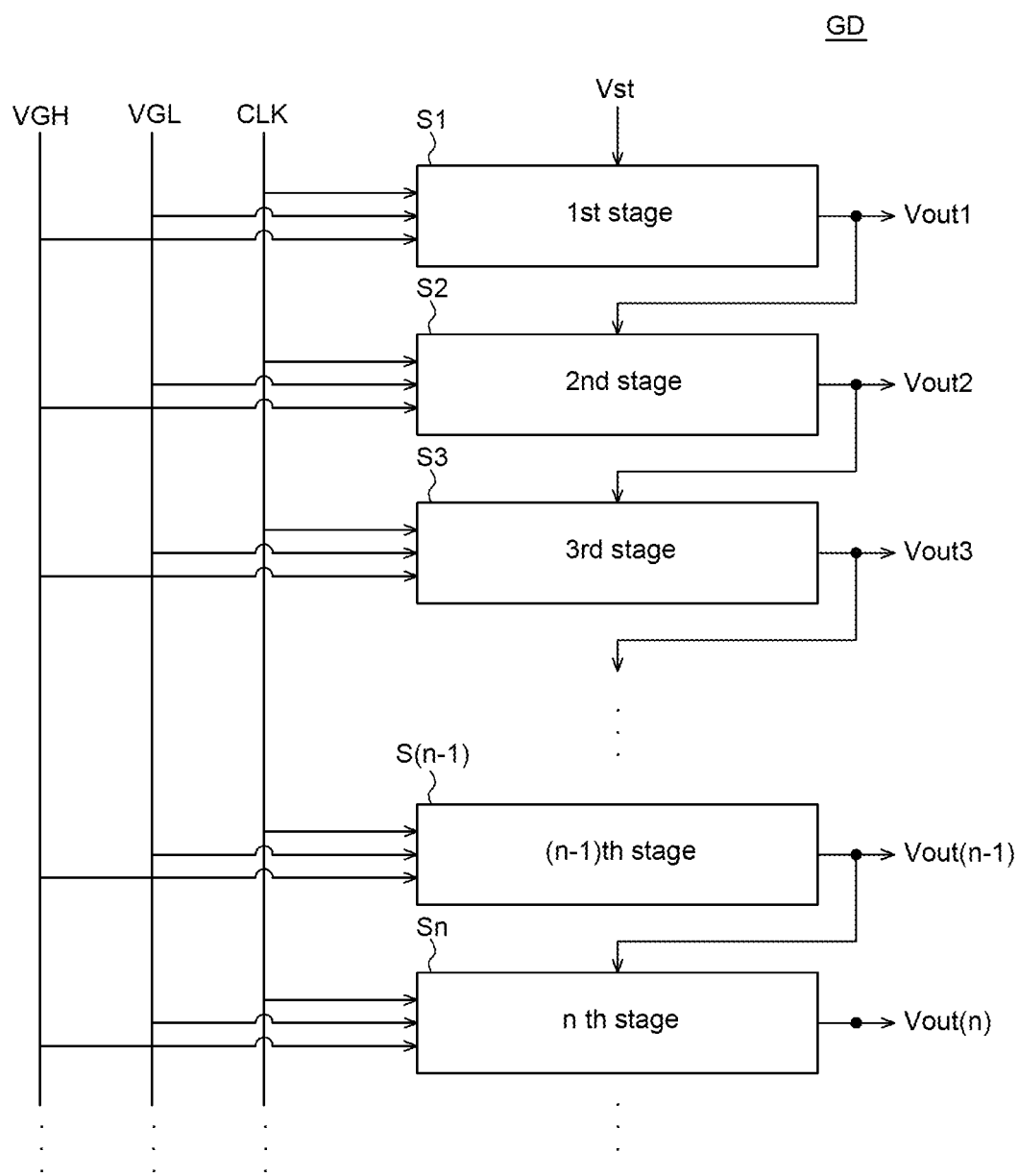
FIG. 4 is a block diagram for illustrating driving of a gate driver according to an embodiment of the present disclosure.

FIG. 4 is a block diagram for illustrating driving of a gate driver according to an embodiment of the present disclosure.

With reference to FIG. 4, the gate driver GD of the stretchable display device according to an embodiment of the present disclosure may be configured of a shift register including first to n-th stages S1, S2, S3 to S(n−1) and Sn that receive a high-potential gate driving voltage VGH and a low-potential gate driving voltage VGL and output gate voltages Vout1, Vout2, Vout3 to Vout(n−1) and Vout(n) to gate lines, respectively, according to gate clock voltages CLK.

As described above, the respective first to n-th stages S1, S2, S3 to S(n−1), and Sn are individually disposed on the outer substrates 121. However, the present disclosure is not limited thereto, and multiple stages among the first to n-th stages S1, S2, S3 to S(n−1), and Sn may be disposed on one outer substrate 121 having an island shape, according to design needs.

In addition, the above-described gate clock voltages CLK may include a plurality of gate clock voltages of different phases. For example, the gate clock voltages CLK may include a first gate clock voltage and a second gate clock voltage, and a phase of the first gate clock voltage is opposite to a phase of the second gate clock voltage. However, the present disclosure is not limited thereto, and the phases and number of the gate clock voltages CLK may be variously changed according to driving needs.

Accordingly, the first stage S1 receives a gate start signal VST and outputs the first gate voltage Vout1 using the gate clock voltage CLK. Thereafter, the second stage S2 outputs the second gate voltage, using the gate clock voltage CLK and the first gate voltage Vout1 output from the first stage S1. Thereafter, the third stage S3 to the n-th stage Sn sequentially output the third to n-th gate voltages Vout3 to Vout(n), using the gate clock voltage CLK and the gate voltages Vout2 to Vout(n−1) output from the previous stages S2 to S(n−1).

Gate Driver and Power Supply Unit

Figure 5A:
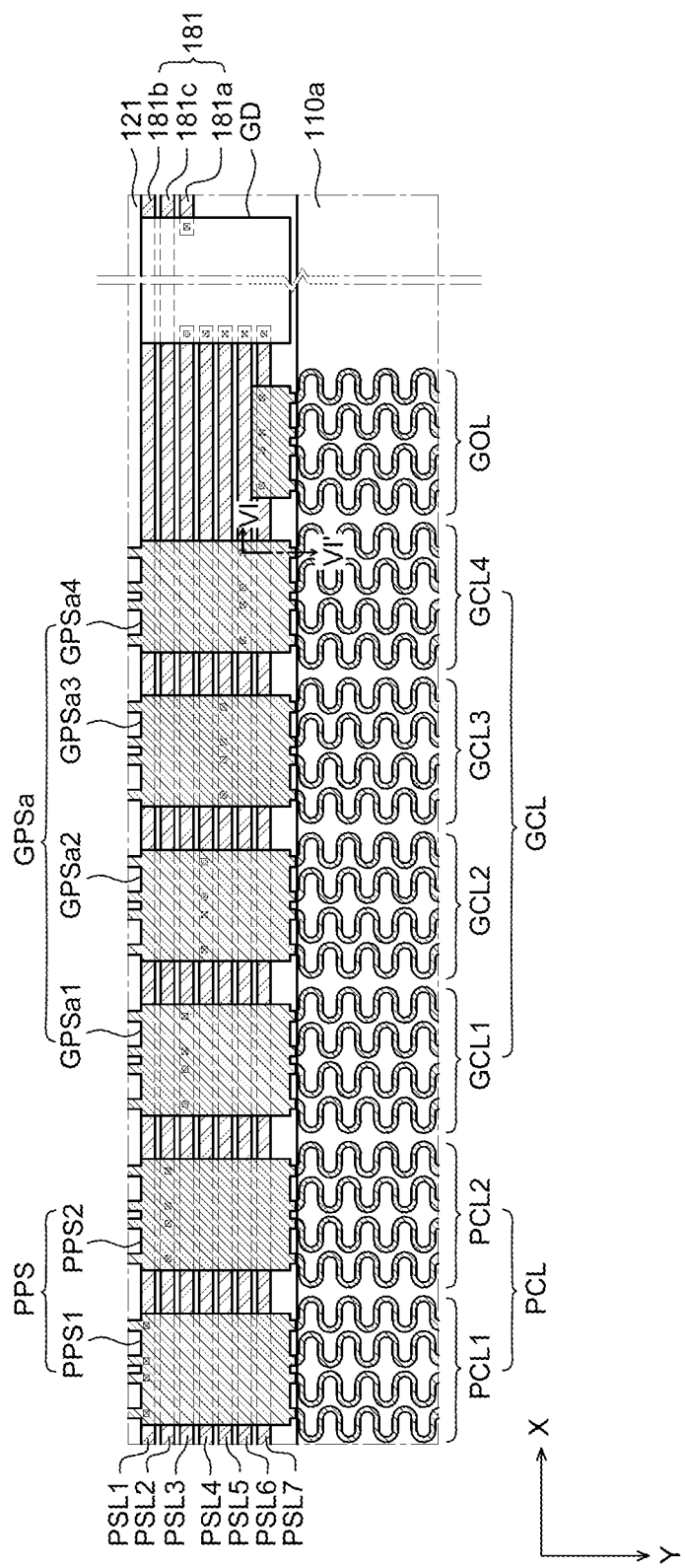
FIGS. 5A and 5B are enlarged plan views of region Y illustrated in FIG. 1.
Figure 5B:
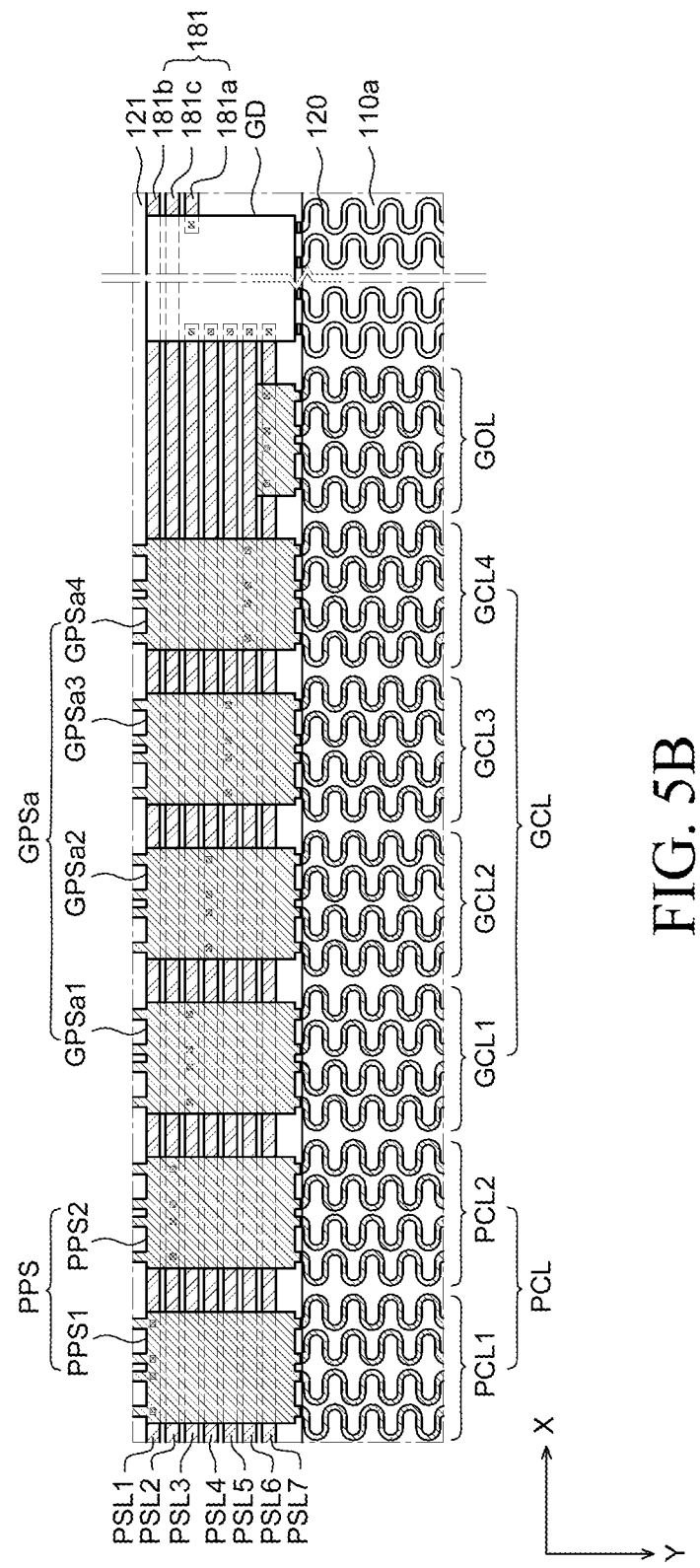
Figure 6:
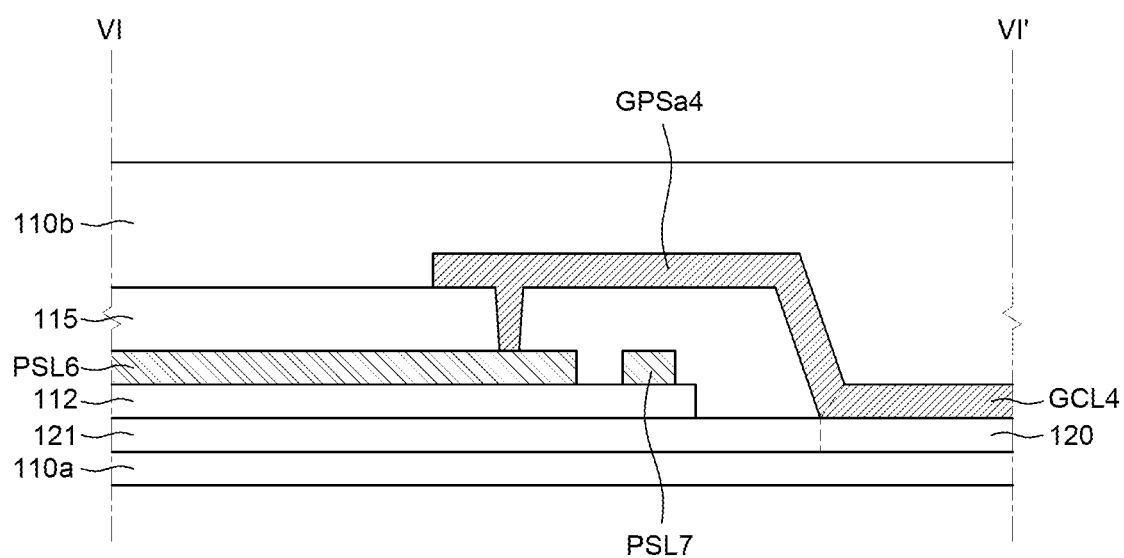
FIG. 6 is a cross-sectional view taken along line VI-VI' of FIG. 5A.

FIGS. 5A and 5B are enlarged plan views of region Y illustrated in FIG. 1. FIG. 6 is a cross-sectional view taken along line VI-VI' of FIG. 5A.

With reference to FIG. 5A, the gate driver GD, the power supply unit PS, and a plurality of power supply lines PSL1 to PSL7 may be formed on the outer substrate 121 disposed in the non-display area NA.

Specifically, the gate driver GD is disposed on one side of the power supply unit PS in the X-axis direction. Then, the gate driver GD receives a plurality of powers from the power supply unit PS and outputs a gate voltage to a first sub-pixel connection line 181a which is a gate line.

And, the plurality of power supply lines PSL1 to PSL7 extend along an X axis and overlaps with the power supply unit PS. Accordingly, the plurality of power supply lines PSL1 to PSL7 are connected to the power supply unit PS through contact holes to transfer a plurality of voltages to the gate driver GD and the plurality of pixels PX. The gate power supply unit GPSa (which may be referred to herein as a gate power supply circuitry GPSa) and the pixel power supply unit PPS (which may be referred to herein as a pixel power supply circuitry PPS) may include any electrical circuitry, features, components, an assembly of electronic components or the like configured to perform the various operations of the gate power supply features and the pixel power supply features as described herein. In some embodiments, the gate power supply units GPSa and the pixel power supply units PPS may be included in or otherwise implemented by processing circuitry such as a microprocessor, microcontroller, integrated circuit, chip, microchip or the like.

In addition, the power supply unit PS may include a gate power supply circuitry GPSa that applies a gate clock voltage and a gate driving voltage to the gate driver GD, and a pixel power supply circuitry PPS that applies a pixel driving voltage to each of the plurality of pixels PX. The gate power supply circuitry GPSa (which may be referred to herein as a gate power supply unit GPSa) and the pixel power supply circuitry PPS (which may be referred to herein as a pixel power supply unit PPS) may include any electrical circuitry, features, components, an assembly of electronic components or the like configured to perform the various operations of the gate power supply features and the pixel power supply features as described herein. In some embodiments, the gate power supply units GPSa and the pixel power supply units PPS may be included in or otherwise implemented by processing circuitry such as a microprocessor, microcontroller, integrated circuit, chip, microchip or the like.

In FIG. 5A, the gate power supply unit GPSa is disposed on one side of the pixel power supply unit PPS in the X-axis direction. That is, in the X-axis direction, the pixel power supply unit PPS, the gate power supply unit GPSa, and the gate driver GD may be sequentially disposed.

The pixel power supply unit PPS applies a high-potential pixel driving voltage and a low-potential pixel driving voltage to each of the plurality of pixels PX disposed in the display area AA. That is, the pixel power supply unit PPS may include a first sub-pixel power supply unit PPS1 that applies a low-potential pixel driving voltage to each of the plurality of pixels PX and a second sub-pixel power supply unit PPS2 that applies a high-potential pixel driving voltage to each of the plurality of pixels PX. In FIG. 5A, the second sub-pixel power supply unit PPS2 is disposed on one side of the first sub-pixel power supply unit PPS1 in the X-axis direction.

In addition, the pixel power supply unit PPS is connected to pixel power connection lines PCL and receives not only a high-potential pixel driving voltage and a low-potential pixel driving voltage, but also supplies the high-potential pixel driving voltage and the low-potential pixel driving voltage to another pixel power supply unit PPS.

Another pixel power supply unit PPS as described above means a separate pixel power supply unit PPS formed on another outer substrate 121 adjacent thereto.

Specifically, the first sub-pixel power supply unit PPS1 is connected to first sub-pixel power connection lines PCL1. Specifically, a plurality of the first sub-pixel power connection lines PCL1 are spaced apart in the Y-axis direction. In addition, the first sub-pixel power connection lines PCL1 extend in the Y-axis direction and electrically connect the plurality of first sub-pixel power supply units PPS1 which are spaced apart from each other. Accordingly, the first sub-pixel power supply unit PPS1 may receive a low-potential pixel driving voltage through the first sub-pixel power connection lines PCL1 or supply the low-potential pixel driving voltage to another first sub-pixel power supply unit PPS1 through the first sub-pixel power connection lines PCL1.

Further, the second sub-pixel power supply unit PPS2 is connected to second sub-pixel power connection lines PCL2. Specifically, a plurality of second sub-pixel power supply units PPS2 are also spaced apart in the Y-axis direction. The second sub-pixel power connection lines PCL2 also extend in the Y-axis direction and electrically connect the plurality of second sub-pixel power supply units PPS2. Accordingly, the second sub-pixel power supply unit PPS2 may receive a high-potential pixel driving voltage through the second sub-pixel power connection lines PCL2 or supply the high-potential pixel driving voltage to another second sub-pixel power supply unit PPS2 through the second sub-pixel power connection lines PCL2.

In this regard, the pixel power supply unit PPS is formed on the outer substrate 121 which is a rigid substrate, and is not stretched, while the pixel power connection lines PCL are formed on the lower substrate 110a which is a stretchable, flexible substrate.

Accordingly, the plurality of pixel power connection lines PCL may have a curved shape so that they are stretched. For example, as illustrated in FIG. 5A, the plurality of pixel power connection lines PCL may have a sine wave shape. However, the shape of the plurality of pixel power connection lines PCL is not limited thereto. The plurality of pixel power connection lines PCL may be variously shaped. For example, the plurality of pixel power connection lines PCL may extend in a zigzag manner, or a plurality of diamond-shaped substrates may be extended by being connected to each other at their vertices. The number and shape of the plurality of pixel power connection lines PCL shown in FIG. 5A is provided by way of example. The number and shape of the plurality of pixel power connection lines PCL may vary depending on the design thereof.

However, when the plurality of pixel power connection lines PCL have a curved shape, the entire length of the plurality of pixel power connection lines PCL increases. Accordingly, resistance of the plurality of pixel power connection lines PCL increases, thereby causing an IR drop of the pixel driving voltage. As a result, a defect in which the plurality of pixels PX do not implement a desired gradation may occur.

Accordingly, each of the pixel power supply units PPS formed on the outer substrate 121 which is a rigid substrate may be configured in a plate shape.

That is, a width of the plate-shaped pixel power supply unit PPS may be greater than that of the pixel power connection line PCL. Accordingly, as illustrated in FIG. 5A, four first sub-pixel power connection lines PCL1 may be connected to the first sub-pixel power supply unit PPS1. However, according to design needs, the number of the first sub-pixel power connection lines PCL1 connected to the first sub-pixel power supply unit PPS1 is not limited thereto and may be variously modified.

Since the width of the plate-shaped pixel power supply unit PPS is greater than the width of the pixel power connection line PCL, resistance of the plate-shaped pixel power supply unit PPS may be lower than that of the pixel power connection line PCL. Accordingly, a degree to which the IR drop of the pixel driving voltage occurs can be reduced. Consequently, by configuring the pixel power supply unit PPS in a plate shape, the pixel driving voltage can reach a target voltage, so that the plurality of pixels PX can normally implement gradation.

As described above, a low-potential pixel driving voltage may be charged in the first sub-pixel power supply unit PPS1, and a high-potential pixel driving voltage may be charged in the second sub-pixel power supply unit PPS2.

In addition, the first sub-pixel power supply unit PPS1 may supply the low-potential pixel driving voltage to a second sub-pixel connection line 181*b* which is a low-potential pixel driving voltage line through the first power supply line PSL1. Specifically, the first sub-pixel power supply unit PPS1 may be electrically connected to the first power supply line PSL1 through contact holes, and the first power supply line PSL1 may be connected to the second sub-pixel connection line 181*b*. Accordingly, the low-potential pixel driving voltage charged in the first sub-pixel power supply unit PPS1 may be transferred to the second sub-pixel connection line 181*b* and supplied to the plurality of pixels PX.

Also, the second sub-pixel power supply unit PPS2 may supply the high-potential pixel driving voltage to a third sub-pixel connection line 181*c* which is a high-potential pixel driving voltage line through the second power supply line PSL2. Specifically, the second sub-pixel power supply unit PPS2 may be electrically connected to the second power supply line PSL2 through contact holes, and the second power supply line PSL2 may be connected to the third sub-pixel connection line 181*c*. Accordingly, the high-potential pixel driving voltage charged in the second sub-pixel power supply unit PPS2 may be transferred to the third sub-pixel connection line 181*c* and supplied to the plurality of pixels PX.

The gate power supply unit GPSa applies a gate clock voltage, a high-potential gate driving voltage, and a low-potential gate driving voltage to the gate driver GD disposed in the non-display area NA. That is, the gate power supply unit GPSa may include a first sub-gate power supply unit GPSa1 for applying a first gate clock voltage to the gate driver GD, a second sub-gate power supply unit GPSa2 for applying a second gate clock voltage to the gate driver GD, a third sub-gate power supply unit GPSa3 for applying a low-potential gate driving voltage to the gate driver GD, and a fourth sub-gate power supply unit GPSa4 for applying a high-potential gate driving voltage to a plurality of the gate drivers GD. In FIG. 5A, the first sub-gate power supply unit GPSa1 to the fourth sub-gate power supply unit GPSa4 may be sequentially disposed in the X-axis direction.

In addition, the gate power supply unit GPSa is connected to the gate power connection lines GCL and receives not only a gate clock voltage, a high-potential gate driving voltage, and a low-potential gate driving voltage, but also supplies the gate clock voltage, the high-potential gate driving voltage, and the low-potential gate driving voltage to another gate power supply unit GPSa.

Another gate power supply unit GPSa as described above is a separate gate power supply unit GPSa formed on another outer substrate 121 adjacent thereto.

Specifically, the first sub-gate power supply unit GPSa1 is connected to first sub-gate power connection lines GCL1. Specifically, a plurality of first sub-gate power supply units GPSa1 are spaced apart in the Y-axis direction, and the first sub-gate power connection lines GCL1 extend in the Y-axis direction and electrically connect the plurality of first sub-gate power supply units GPSa1. Accordingly, the first sub-gate power supply unit GPSa1 receives a first gate clock voltage through the first sub-gate power connection lines GCL1 or supplies the first gate clock voltage to another first sub-gate power supply unit GPSa1 through the first sub-gate power connection lines GCL1.

In addition, the second sub-gate power supply unit GPSa2 is connected to second sub-gate power connection lines GCL2. Specifically, a plurality of second sub-gate power supply units GPSa2 are also spaced apart in the Y-axis direction, and the second sub-gate power connection lines GCL2 extend in the Y-axis direction and electrically connect the plurality of second sub-gate power supply units GPSa2. Accordingly, the second sub-gate power supply unit GPSa2 receives a second gate clock voltage through the second sub-gate power connection lines GCL2 or supplies the second gate clock voltage to another second sub-gate power supply unit GPSa2 through the second sub-gate power connection lines GCL2.

Further, the third sub-gate power supply unit GPSa3 is connected to third sub-gate power connection lines GCL3. Specifically, a plurality of third sub-gate power supply units GPSa3 are also spaced apart in the Y-axis direction, and the third sub-gate power connection lines GCL3 extend in the Y-axis direction and electrically connect the plurality of third sub-gate power supply units GPSa3. Accordingly, the third sub-gate power supply unit GPSa3 receives a low-potential gate driving voltage through the third sub-gate power connection lines GCL3 or supplies the low-potential gate driving voltage to another third sub-gate power supply unit GPSa3 through the third sub-gate power connection lines GCL3.

Further, the fourth sub-gate power supply unit GPSa4 is connected to fourth sub-gate power connection lines GCL4. Specifically, a plurality of fourth sub-gate power supply units GPSa4 are also spaced apart in the Y-axis direction, and the fourth sub-gate power connection lines GCL4 extend in the Y-axis direction and electrically connect the plurality of fourth sub-gate power supply units GPSa4. Accordingly, the fourth sub-gate power supply unit GPSa4 receives a high-potential gate driving voltage through the fourth sub-gate power connection lines GCL4 or supplies the high-potential gate driving voltage to another fourth sub-gate power supply unit GPSa4 through the fourth sub-gate power connection lines GCL4.

In this regard, the gate power supply unit GPSa is formed on the outer substrate 121 which is a rigid substrate, and thus, is not stretched, while the gate power connection line GCL is formed on the lower substrate 110a which is a stretchable, flexible substrate.

Accordingly, the plurality of gate power connection lines GCL may have a curved shape so that they are stretched. For example, as illustrated in FIG. 5A, the plurality of gate power connection lines GCL may have a sine wave shape. However, the shape of the plurality of gate power connection lines GCL is not limited thereto. The plurality of gate power connection lines GCL may be variously shaped. For example, the plurality of gate power connection lines GCL may extend in a zigzag manner, or a plurality of diamond-shaped substrates may be extended by being connected to each other at their vertices. In addition, the number and shape of the plurality of gate power connection lines GCL shown in FIG. 5A is provided by way of example. The number and shape of the plurality of gate power connection lines GCL may vary depending on the design thereof.

In addition, each of the gate power supply units GPSa formed on the outer substrate 121 which is a rigid substrate may be configured in a plate shape.

That is, a width of the plate-shaped gate power supply unit GPSa may be greater than a width of the gate power connection line GCL. Accordingly, as illustrated in FIG. 5A, four first sub-gate power connection lines GCL1 may be connected to the first sub-gate power supply unit GPSa1. However, according to design needs, the number of the first sub-gate power connection lines GCL1 connected to the first sub-gate power supply unit GPSa1 is not limited thereto and may be variously modified.

Since the width of the plate-shaped gate power supply unit GPSa is greater than that of the gate power connection line GCL, resistance of the plate-shaped gate power supply unit GPSa may be lower than that of the gate power connection line GCL. Accordingly, a degree to which an IR drop of the gate driving voltage occurs can be reduced. Consequently, by configuring the gate power supply unit GPSa in a plate shape, the gate driving voltage can reach a target voltage.

As described above, the first gate clock voltage may be charged in the first sub-gate power supply unit GPSa1, the second gate clock voltage may be charged in the second sub-gate power supply unit GPSa2, the low-potential gate driving voltage may be charged in the third sub-gate power supply unit GPSa3, and the high-potential gate driving voltage may be charged in the fourth sub-gate power supply unit GPSa4.

In addition, the first sub-gate power supply unit GPSa1 may supply the first gate clock voltage to the gate driver GD through the third power supply line PSL3. Specifically, the first sub-gate power supply unit GPSa1 may be electrically connected to the third power supply line PSL3 through contact holes, and the third power supply line PSL3 may be connected to the gate driver GD through a contact hole. Accordingly, the first gate clock voltage charged in the first sub-gate power supply unit GPSa1 may be supplied to the gate driver GD.

Also, the second sub-gate power supply unit GPSa2 may supply the second gate clock voltage to the gate driver GD through the fourth power supply line PSL4. Specifically, the second sub-gate power supply unit GPSa2 may be electrically connected to the fourth power supply line PSL4 through contact holes, and the fourth power supply line PSL4 may be connected to the gate driver GD through a contact hole. Accordingly, the second gate clock voltage charged in the second sub-gate power supply unit GPSa2 may be supplied to the gate driver GD.

Also, the third sub-gate power supply unit GPSa3 may supply the low-potential gate driving voltage to the gate driver GD through the fifth power supply line PSL5. Specifically, the third sub-gate power supply unit GPSa3 may be electrically connected to the fifth power supply line PSL5 through contact holes, and the fifth power supply line PSL5 may be connected to the gate driver GD through a contact hole. Accordingly, the low-potential gate driving voltage charged in the third sub-gate power supply unit GPSa3 may be supplied to the gate driver GD.

In addition, the fourth sub-gate power supply unit GPSa4 may supply a fourth gate clock voltage to the gate driver GD through the sixth power supply line PSL6. Specifically, the fourth sub-gate power supply unit GPSa4 may be electrically connected to the sixth power supply line PSL6 through contact holes, and the sixth power supply line PSL6 may be connected to the gate driver GD through a contact hole. Accordingly, the high-potential gate driving voltage charged in the fourth sub-gate power supply unit GPSa4 may be supplied to the gate driver GD.

Meanwhile, the gate driver GD may output a gate voltage to gate output lines GOL and apply the gate voltage to another gate driver GD of the next stage. Specifically, the gate driver GD may be electrically connected to the seventh power supply line PSL7 through contact holes, and the seventh power supply line PSL7 may be electrically connected to the gate output lines GOL. Accordingly, the gate voltage output from the gate driver GD may be applied to another gate driver GD of the next stage.

With reference to FIGS. 5A and 6, the connection substrates 120 may be disposed under the plurality of pixel power connection lines PCL, the plurality of gate power connection lines GCL, and the gate output lines GOL.

In addition, the connection substrates 120 may have a shape the same as those of the plurality of pixel power connection lines PCL, the plurality of gate power connection lines GCL, and the gate output line GOL.

Accordingly, the plurality of connection substrates 120 also have a curved shape. For example, as shown in FIG. 5A, the plurality of connection substrates 120 may have a sine wave shape. However, the shape of the plurality of connection substrates 120 is not limited thereto. The plurality of connection substrates 120 may be variously shaped. For example, the plurality of connection substrates 120 may extend in a zigzag manner, or a plurality of diamond-shaped connection substrates 120 may be extended by being connected to each other at their vertices.

As described above, the connection substrates 120 are disposed under the plurality of pixel power connection lines PCL, the plurality of gate power connection lines GCL, and the gate output lines GOL, so that stretching stress received by the plurality of pixel power connection lines PCL, the plurality of gate power connection lines GCL, and the gate output lines GOL when the stretchable display device 100 is stretched may be reduced. Accordingly, even if the stretching of the stretchable display device 100 is repeated, cracks do not occur in the plurality of pixel power connection lines PCL, the plurality of gate power connection lines GCL, and the gate output lines GOL, so that the pixel driving voltage, the gate clock voltage, and the gate driving voltage can be stably supplied.

In addition, with reference to FIG. 5B, in some embodiments, the connection substrates may be disposed between the plurality of gate drivers GD.

That is, the connection substrates 120 may be disposed in all of areas between the plurality of outer substrates 121. Accordingly, the connection substrates 120 may be uniformly disposed between the plurality of outer substrates 121.

Accordingly, the stretchable display device 100 according to an embodiment of the present disclosure can disperse the stretching stress by uniformly disposing the connection substrates 120 between the plurality of outer substrates 121. As a result, the occurrence of cracks during the stretching of the stretchable display device 100 can be prevented.

Hereinafter, with reference to FIG. 6, a stacking relationship and a connection relationship of the plurality of power supply lines and the power supply unit will be described.

With reference to FIG. 6, the outer substrate 121 and the connection substrate are disposed on the lower substrate.

Both the outer substrate 121 and the connection substrate 120 may be formed of the same material and formed by the same process.

That is, each of the outer substrate 121 and the connection substrate may be formed of a plastic material having flexibility, for example, polyimide (PI), polyacrylate, polyacetate, or the like. However, it is not limited thereto, and may be formed of other materials.

In addition, the buffer layer 112 may be disposed on the outer substrate 121. The buffer layer 112 may be formed of an insulating material and may be composed of a single layer or multiple layers of an inorganic layer formed of for example, silicon nitride (SiNx), silicon oxide (SiOx), silicon oxynitride (SiON), or the like. However, the buffer layer 112 may be omitted depending on the structure or characteristics of the stretchable display device 100.

The plurality of power supply lines PSL1 to PSL7 may be formed on the buffer layer 112. For example, as illustrated in FIG. 6, the sixth power supply line PSL6 and the seventh power supply line PSL7 may be disposed on the buffer layer 112. The sixth power supply line PSL6 and the seventh power supply line PSL7 are disposed to be spaced apart on the same layer as the source electrode 153 and the drain electrode 154. In addition, the plurality of power supply lines PSL1 to PSL7 may be formed of the same material as the source electrode 153 and the drain electrode 154. That is, the plurality of power supply lines PSL1 to PSL7 may be formed of any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof, but are not limited thereto.

In some embodiments, the plurality of power supply lines PSL1 to PSL7 may be spaced apart from the gate electrode 151 and formed of the same material as the gate electrode 151.

Then, the planarization layer 115 is formed on the plurality of power supply lines PSL1 to PSL7. The planarization layer 115 planarizes an upper portion of the transistor 150. The planarization layer 115 may be composed of a single layer or a plurality of layers, and may be formed of an organic material. Accordingly, the planarization layer 115 may be referred to as an organic insulating layer. For example, the planarization layer 115 may be formed of an acrylic organic material, but is not limited thereto.

In addition, the gate output line GOL, the plurality of gate power connection lines GCL, and the plurality of pixel power connection lines GCL may be disposed on the connection substrate 120. For example, as illustrated in FIG. 6, the fourth sub-gate power connection line GCL4 may be disposed on the connection substrate 120.

In addition, the gate power supply unit GPSa and the pixel power supply unit PPS may be disposed on the planarization layer 115. For example, as illustrated in FIG. 6, the fourth sub-gate power supply unit GPSa4 may be disposed on the planarization layer 115.

In addition, the gate power supply unit GPSa and the pixel power supply unit PPS may be formed of the same material as the gate output line GOL, the plurality of gate power connection lines GCL, and the plurality of pixel power connection lines PCL and may be electrically connected thereto. In addition, the gate power supply unit GPSa and the pixel power supply unit PPS may be electrically connected to the plurality of power supply lines PSL1 to PSL7 through contact holes.

For example, as illustrated in FIG. 6, the fourth sub-gate power connection line GCL4 is formed of the same material as the fourth sub-gate power supply unit GPSa4 and may be electrically connected thereto. In addition, the fourth sub-gate power supply unit GPSa4 may be electrically connected to the sixth power supply line PSL6 through contact holes. Accordingly, the high-potential gate driving voltage charged in the fourth sub-gate power supply unit GPSa4 may be supplied to the gate driver GD.

As described above, in the stretchable display device 100 according to an embodiment of the present disclosure, the gate driver GD and the power supply unit PS are disposed on the outer substrate 121, and the gate output line GOL, the gate power connection line GCL, and the pixel power supply line PSL are disposed between the outer substrates 121.

Accordingly, each of the plurality of gate drivers GD outputs a gate voltage to the plurality of pixels PX disposed on the same line, and the plurality of power supply units PS outputs a pixel driving voltage to the plurality of pixels PX.

That is, the stretchable display device 100 according to an embodiment of the present disclosure includes the gate drivers GD and the power supply units PS that are stretchable to thereby drive the plurality of pixels PX.

Hereinafter, a stretchable display device according to another embodiment of the present disclosure will be described. The stretchable display device according to another embodiment of the present disclosure is different from the stretchable display device according to an embodiment of the present disclosure, only in terms of an overlapping relationship of the gate drivers GD and the power supply unit PS. And, the stretchable display device according to another embodiment of the present disclosure is the same as the stretchable display device according to an embodiment of the present disclosure, in terms of technical characteristics of the gate output lines GOL, the gate power connection lines GCL, and the pixel power supply lines PSL. Accordingly, the overlapping relationship of the gate drivers GD and the power supply unit PS of the stretchable display device according to another embodiment of the present disclosure will be described in detail below.

Overlapping Gate Driver and Power Supply Unit

Figure 7:
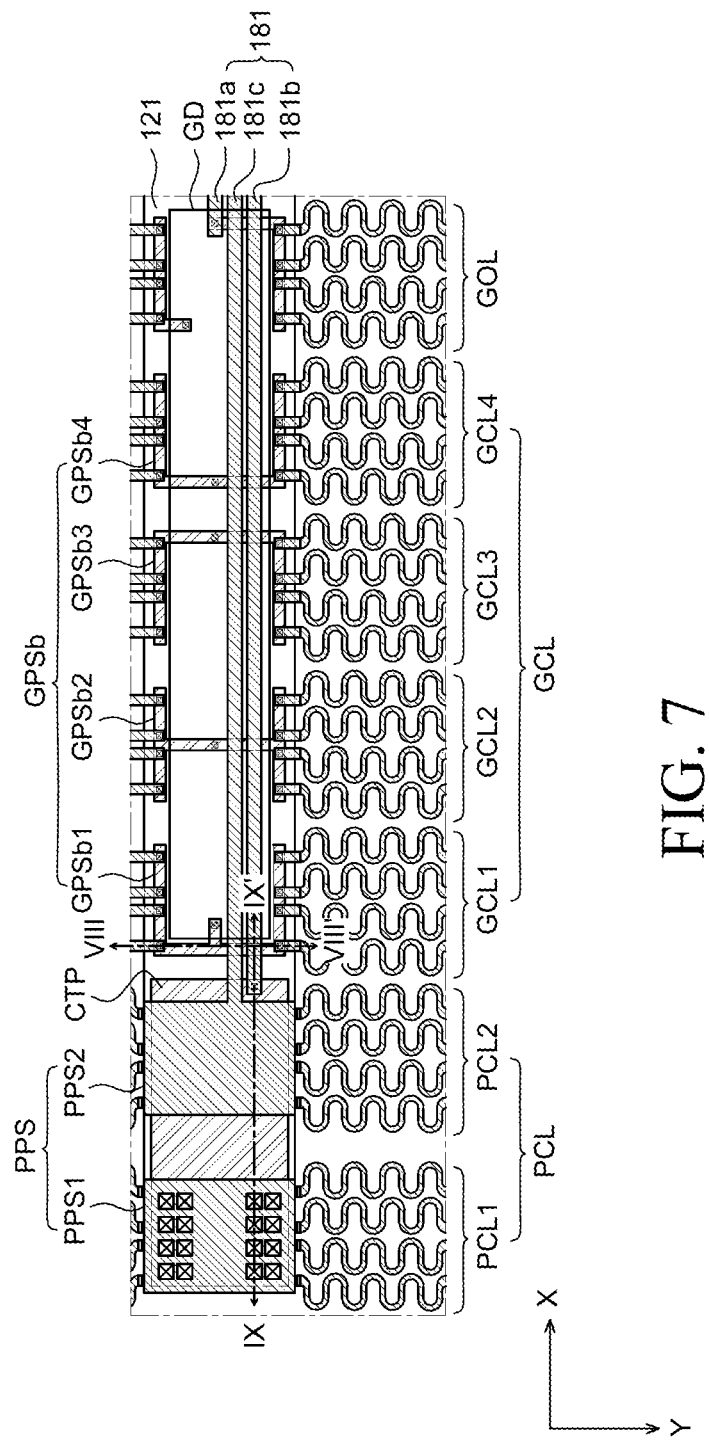
FIG. 7 is an enlarged plan view of a non-display area of a stretchable display device according to another embodiment of the present disclosure.
Figure 8:
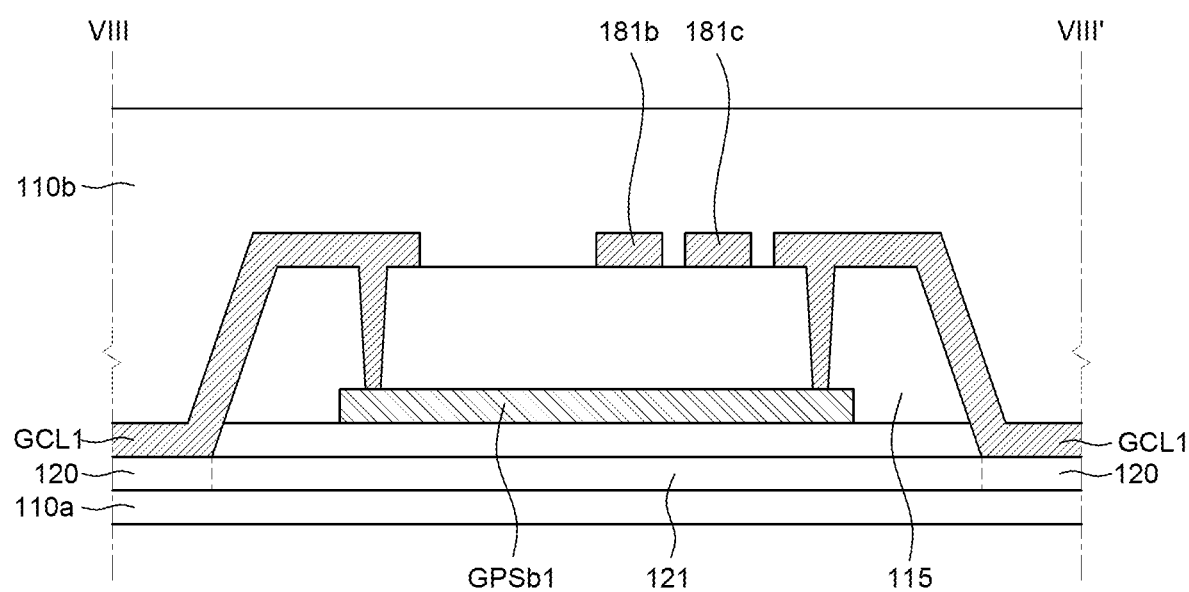
FIG. 8 is a cross-sectional view taken along line VIII-VIII' of FIG. 7.
Figure 9:
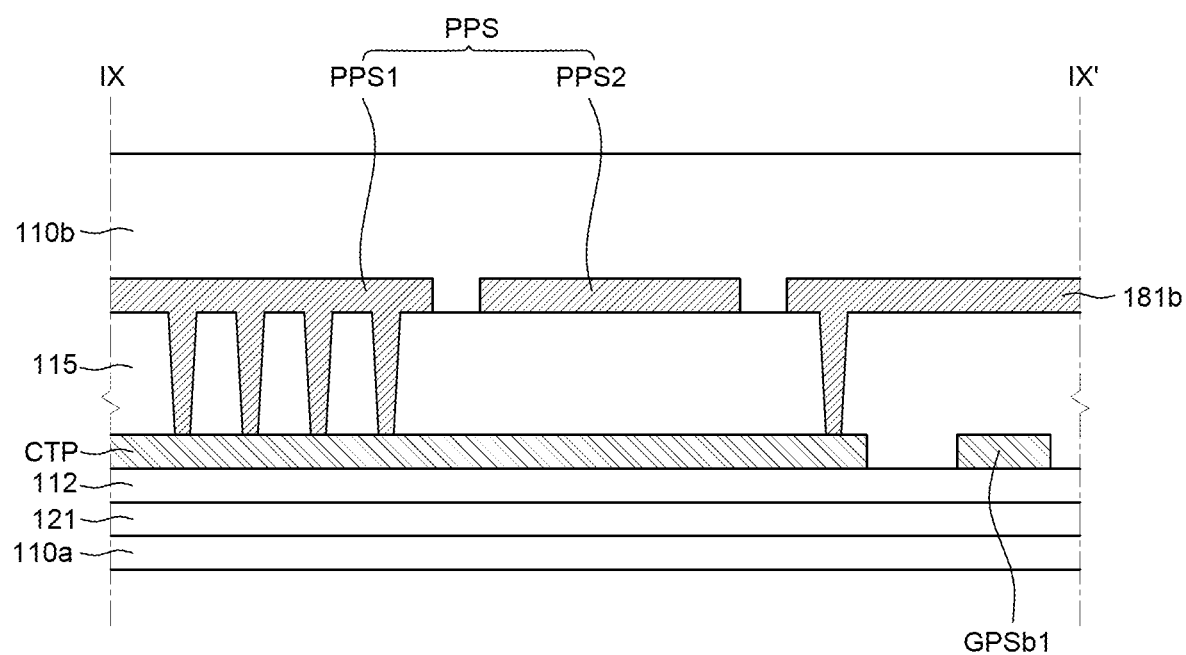
FIG. 9 is a cross-sectional view taken along line IX-IX' of FIG. 8.

FIG. 7 is an enlarged plan view of a non-display area of a stretchable display device according to another embodiment of the present disclosure. FIG. 8 is a cross-sectional view taken along line VIII-VIII' of FIG. 7. FIG. 9 is a cross-sectional view taken along line IX-IX' of FIG. 8.

In a stretchable display device 200 according to another embodiment of the present disclosure, the power supply unit PS and the gate drivers GD may overlap with each other.

As illustrated in FIG. 7, a gate power supply unit GPSb of the power supply unit PS may overlap with the gate drivers GD. In addition, the gate power supply unit GPSb may be built in the gate drivers GD.

Specifically, the gate power supply unit GPSb may include a first sub-gate power supply unit GPSb1 for applying a first gate clock voltage to the gate driver GD, a second sub-gate power supply unit GPSb2 for applying a second gate clock voltage to the gate driver GD, a third sub-gate power supply unit GPSb3 for applying a low-potential gate driving voltage to the gate driver G, and a fourth sub-gate power supply unit GPSb4 for applying a high-potential gate driving voltage to the plurality of gate drivers GD.

In addition, each of the first sub-gate power supply unit GPSb1, the second sub-gate power supply unit GPSb2, the third sub-gate power supply unit GPSb3, and the fourth sub-gate power supply unit GPSb4 may be variously formed such that they are electrically connected to the gate power connection lines GCL and connected to the gate drivers GD.

To this end, in FIG. 7, each of the first sub-gate power supply unit GPSb1, the second sub-gate power supply unit GPSb2, the third sub-gate power supply unit GPSb3, and the fourth sub-gate power supply unit GPSb4 may be separated into a portion overlapping with the gate power connection lines GCL and a portion overlapping with the gate driver GD.

For example, with reference to FIGS. 7 and 8, the first sub-gate power supply unit GPSb1 may be electrically connected to the first sub-gate power connection lines GCL1 through a plurality of contact holes at both sides thereof in the Y-axis direction. Accordingly, the first sub-gate power supply unit GPSb1 receives a first gate clock voltage through the first sub-gate power connection lines GCL1 or supplies the first gate clock voltage to another first sub-gate power supply unit GPSa1 through the first sub-gate power connection lines GCL1.

Also, the first sub-gate power supply unit GPSb1 may be connected to the gate driver GD through a contact hole. Accordingly, the first gate clock voltage charged in the first sub-gate power supply unit GPSb1 may be supplied to the gate driver GD.

In the same manner, the second sub-gate power supply unit GPSb2 may be electrically connected to the second sub-gate power connection lines GCL2 through a plurality of contact holes at both sides thereof in the Y-axis direction. Accordingly, the second sub-gate power supply unit GPSb2 receives a second gate clock voltage through the second sub-gate power connection lines GCL2 or supplies the second gate clock voltage to another second sub-gate power supply unit GPSa2 through the second sub-gate power connection lines GCL2.

Also, the second sub-gate power supply unit GPSb2 may be connected to the gate driver GD through a contact hole. Accordingly, the second gate clock voltage charged in the second sub-gate power supply unit GPSb2 may be supplied to the gate driver GD.

In the same manner, the third sub-gate power supply unit GPSb3 may be electrically connected to the third sub-gate power connection lines GCL3 through a plurality of contact holes at both sides in the Y-axis direction. Accordingly, the third sub-gate power supply unit GPSb3 receives a low-potential gate driving voltage through the third sub-gate power connection lines GCL3 or supplies the low-potential gate driving voltage to another third sub-gate power supply unit GPSa3 through the third sub-gate power connection lines GCL3.

Also, the third sub-gate power supply unit GPSb3 may be connected to the gate driver GD through a contact hole. Accordingly, the low-potential gate driving voltage charged in the third sub-gate power supply unit GPSb3 may be supplied to the gate driver GD.

In the same manner, the fourth sub-gate power supply unit GPSb4 may be electrically connected to the fourth sub-gate power connection lines GCL4 through a plurality of contact holes at both sides thereof in the Y-axis direction. Accordingly, the fourth sub-gate power supply unit GPSb4 receives a high-potential gate driving voltage through the fourth sub-gate power connection lines GCL4 or supplies the high-potential gate driving voltage to another fourth sub-gate power supply unit GPSa4 through the fourth sub-gate power connection lines GCL4.

Also, the fourth sub-gate power supply unit GPSb4 may be connected to the gate driver GD through a contact hole. Accordingly, the high-potential gate driving voltage charged in the fourth sub-gate power supply unit GPSb4 may be supplied to the gate driver GD.

In addition, each of the first sub-gate power supply unit GPSb1, the second sub-gate power supply unit GPSb2, the third sub-gate power supply unit GPSb3, and the fourth sub-gate power supply unit GPSb4 may be formed of the same material as the source electrode 153 and the drain electrode 154. That is, each of the first sub-gate power supply unit GPSb1, the second sub-gate power supply unit GPSb2, the third sub-gate power supply unit GPSb3, and the fourth sub-gate power supply unit GPSb4 may be formed of any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof, but is not limited thereto.

In some embodiments, each of the first sub-gate power supply unit GPSb1, the second sub-gate power supply unit GPSb2, the third sub-gate power supply unit GPSb3, and the fourth sub-gate power supply unit GPSb4 may be disposed on the same layer as the gate electrode 151 to be spaced apart therefrom, and may be formed of the same material as the gate electrode 151.

As described above, the power supply unit PS and the gate drivers GD may overlap with each other. Accordingly, a size of the non-display area NA in which the power supply unit PS and the gate drivers GD are disposed may be reduced. Accordingly, in the stretchable display device 200 according to another embodiment of the present disclosure, a size of the bezel area may be reduced, so that a size of the display area displaying an image may be relatively increased.

Next, with reference to FIGS. 7 and 9, the first sub-pixel power supply unit PPS1 may supply a low-potential pixel driving voltage to the second sub-pixel connection line 181b which is a low-potential pixel driving voltage line, through a contact portion CTP. The contact portion CTP may be formed on a layer different from the pixel power supply unit PPS, and may overlap with the pixel power supply unit PPS. Specifically, the first sub-pixel power supply unit PPS1 may be electrically connected to the contact portion CTP through a plurality of contact holes, and the contact portion CTP may be connected to the second sub-pixel connection line 181b through another contact hole. Accordingly, the low-potential pixel driving voltage charged in the first sub-pixel power supply unit PPS1 may be transferred to the second sub-pixel connection line 181b and supplied to the plurality of pixels PX. That is, the first sub-pixel power supply unit PPS1 and the second sub-pixel connection line 181b may be connected to each other in a jumping structure through the contact portion CTP.

The contact portion CTP formed on the outer substrate 121 which is a rigid substrate, may be configured in a plate shape. And, as shown in FIG. 9, a width of the plate-shaped contact portion CTP may be greater than the sum of a width of the first sub-pixel power supply unit PPS1 and a width of the second sub-pixel power supply unit PPS2. Accordingly, resistance of the plate-shaped contact portion CTP may be relatively low. Thus, the degree to which the IR drop of the pixel driving voltage occurs can be reduced. Consequently, by configuring the contact portion CTP in a plate shape, the pixel driving voltage can reach a target voltage, so that the plurality of pixels PX can normally implement gradation.

In addition, FIGS. 7 and 9 illustrate that the contact portion CTP is formed of the same material as the source electrode 153 and the drain electrode 154 and is formed on the same layer as the source electrode 153 and the drain electrode 154. However, the present disclosure is not limited thereto. The contact portion CTP may be disposed on the same layer as the gate electrode 151 to be spaced apart therefrom, and may be formed of the same material as the gate electrode 151.

The embodiments of the present disclosure can also be described as follows:

According to an aspect of the present disclosure, a stretchable display device includes a lower substrate on which a display area displaying an image and a non-display area adjacent to the display area are defined; a plurality of pixel substrates disposed in the display area; a plurality of outer substrates disposed in the non-display area; a plurality of pixels disposed on the plurality of pixel substrates; and a plurality of gate drivers disposed on the plurality of outer substrates and outputting gate voltages to the plurality of pixels. Thus, even in a state in which the stretchable display device is stretched, the pixels can be normally driven.

The stretchable display device may further comprise a gate power supply unit disposed on the plurality of outer substrates and supplying a gate clock voltage and a gate driving voltage to the plurality of gate drivers.

The gate power supply unit may have a plate shape.

The stretchable display device may further comprise a plurality of gate power connection lines disposed between the plurality of outer substrates and electrically connected to the gate power supply unit.

The plurality of gate power connection lines may have a curved shape.

The stretchable display device may further comprise a connection substrate disposed under the plurality of gate power connection lines.

The plurality of gate drivers and the gate power supply unit may overlap with each other.

The stretchable display device may further comprise a pixel power supply unit disposed on the plurality of outer substrates and supplying a pixel driving voltage to each of the plurality of pixels.

The pixel power supply unit may have a plate shape.

The stretchable display device may further comprise a plurality of pixel power connection lines disposed between the plurality of outer substrates and electrically connected to the pixel power supply unit.

The plurality of pixel power connection lines may have a curved shape.

The stretchable display device may further comprise a connection substrate disposed under the plurality of pixel power connection lines.

The pixel power supply unit may include a first sub-pixel power supply unit and a second sub-pixel power supply unit adjacent to the first sub-pixel power supply unit.

The first sub-pixel power supply unit may be electrically connected to a pixel connection line through a contact portion formed on a layer different from the pixel power supply unit.

The contact portion may overlap with the pixel power supply unit and have a plate shape.

A width of the contact portion may be greater than a sum of a width of the first sub-pixel power supply unit and a width of the second sub-pixel power supply unit.

The plurality of gate drivers may be electrically connected to each other by a gate output line.

The stretchable display device may further comprise a connection substrate disposed between the plurality of gate drivers, the connection substrate having a curved shape.

According to another aspect of the present disclosure, a stretchable display device includes a stretchable substrate on which a display area displaying an image and a non-display area adjacent to the display area are defined; a plurality of first rigid substrates disposed in the display area; a plurality of second rigid substrates disposed in the non-display area; a plurality of pixels disposed on the plurality of first rigid substrates; a plurality of gate drivers disposed on the plurality of second rigid substrates and including a plurality of transistors; and a plurality of power supply units disposed on the plurality of second rigid substrates and connected to the plurality of gate drivers and the plurality of pixels. Thus, even when the stretchable display device is stretched, a driving voltage can be normally supplied.

Each of the second rigid substrates may extend in one direction, and each of the plurality of gate drivers and each of the plurality of power supply units may be disposed to be adjacent to each other in the one direction.

The plurality of gate drivers are disposed more adjacent to the display area than the plurality of power supply units.

The plurality of power supply units may include a gate power supply unit applying a gate clock voltage and a gate driving voltage to the gate drivers; and a pixel power supply unit applying a pixel driving voltage to each of the plurality of pixels.

The gate power supply unit is disposed more adjacent to the gate drivers than the pixel power supply unit.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A stretchable display device, comprising:
   a lower substrate on which a display area displaying an image and a non-display area adjacent to the display area are defined;
   a plurality of pixel substrates disposed in the display area;
   a plurality of outer substrates disposed in the non-display area;
   a plurality of pixels disposed on the plurality of pixel substrates;
   a plurality of gate drivers disposed on the plurality of outer substrates and outputting gate voltages to the plurality of pixels; and
   a gate power supply circuitry disposed on the plurality of outer substrates and supplying a gate clock voltage and a gate driving voltage to the plurality of gate drivers.

2. The stretchable display device of claim 1, wherein the gate power supply circuitry is implemented in a plate shape.

3. The stretchable display device of claim 1, further comprising:
   a plurality of gate power connection lines disposed between the plurality of outer substrates and electrically connected to the gate power supply circuitry.

4. The stretchable display device of claim 3, wherein the plurality of gate power connection lines includes a curved shape.

5. The stretchable display device of claim 3, further comprising:
   a connection substrate disposed under the plurality of gate power connection lines.

6. The stretchable display device of claim 1, wherein the plurality of gate drivers and the gate power supply circuitry overlap with each other.

7. The stretchable display device of claim 1, further comprising:
   a pixel power supply circuit disposed on the plurality of outer substrates and supplying a pixel driving voltage to each of the plurality of pixels.

8. The stretchable display device of claim 7, wherein the pixel power supply circuitry is implemented in a plate shape.

9. The stretchable display device of claim 7, further comprising:
   a plurality of pixel power connection lines disposed between the plurality of outer substrates and electrically connected to the pixel power supply circuitry.

10. The stretchable display device of claim 9, wherein the plurality of pixel power connection lines includes a curved shape.

11. The stretchable display device of claim 9, further comprising:
    a connection substrate disposed under the plurality of pixel power connection lines.

12. The stretchable display device of claim 7, wherein:

the pixel power supply circuitry includes a first sub-pixel power supply circuitry and a second sub-pixel power supply circuitry adjacent to the first sub-pixel power supply circuitry, the first sub-pixel power supply circuitry is electrically connected to a pixel connection line through a contact portion formed on a layer different from the pixel power supply circuitry, the contact portion overlaps with the pixel power supply circuitry and is implemented in a plate shape.

13. The stretchable display device of claim 12, wherein a width of the contact portion is greater than a sum of a width of the first sub-pixel power supply circuitry and a width of the second sub-pixel power supply circuitry.

14. The stretchable display device of claim 1, wherein the plurality of gate drivers are electrically connected to each other by one or more gate output lines.

15. The stretchable display device of claim 1, further comprising:
a connection substrate disposed between the plurality of gate drivers, the connection substrate having a curved shape.

16. A display device, comprising:
a stretchable substrate on which a display area displaying an image and a non-display area adjacent to the display area are defined;
a plurality of first rigid substrates disposed in the display area;
a plurality of second rigid substrates disposed in the non-display area;
a plurality of pixels disposed on the plurality of first rigid substrates;
a plurality of gate drivers disposed on the plurality of second rigid substrates and including a plurality of transistors; and
a plurality of power supply circuitries disposed on the plurality of second rigid substrates and connected to the plurality of gate drivers and the plurality of pixels
wherein the plurality of power supply circuitries include a gate power supply circuitry applying a gate clock voltage and a gate driving voltage to the gate drivers; and a pixel power supply circuitry applying a pixel driving voltage to each of the plurality of pixels.

17. The display device of claim 16,
wherein each of the second rigid substrates extends in a direction, and
each of the plurality of gate drivers and each of the plurality of power supply circuitries are disposed to be adjacent to each other in the direction.

18. The display device of claim 17, wherein the plurality of gate drivers are disposed more adjacent to the display area than the plurality of power supply circuitries.

19. The display device of claim 16, wherein the gate power supply circuitry is disposed more adjacent to the gate drivers than the pixel power supply circuitry.

* * * * *